United States Patent
Hazama

(10) Patent No.: US 7,805,660 B2
(45) Date of Patent: Sep. 28, 2010

(54) MULTILEVEL SEMICONDUCTOR MEMORY, WRITE/READ METHOD THERETO/THEREFROM AND STORAGE MEDIUM STORING WRITE/READ PROGRAM

(76) Inventor: Katsuki Hazama, c/o Nippon Steel Corporation, 6-3, Otemachi 2-chome, Chiyoda-ku, Tokyo-to (JP)

( * ) Notice: Subject to any disclaimer, the term of this patent is extended or adjusted under 35 U.S.C. 154(b) by 1051 days.

(21) Appl. No.: 11/513,907

(22) Filed: Aug. 31, 2006

(65) Prior Publication Data

US 2007/0130440 A1   Jun. 7, 2007

Related U.S. Application Data

(60) Continuation of application No. 10/642,764, filed on Aug. 19, 2003, now Pat. No. 7,139,895, which is a division of application No. 09/438,295, filed on Nov. 12, 1999, now Pat. No. 6,857,099, which is a division of application No. 08/931,519, filed on Sep. 16, 1997, now Pat. No. 6,023,781.

(30) Foreign Application Priority Data

Sep. 18, 1996  (JP)  ........................................ 267844
Dec. 6, 1996  (JP)  ........................................ 342663

(51) Int. Cl.
 *G11C 29/00* (2006.01)
(52) U.S. Cl. .................................... 714/773; 714/778
(58) Field of Classification Search .............. 714/773, 714/777, 778
See application file for complete search history.

(56) References Cited

U.S. PATENT DOCUMENTS 3,798,360 A   3/1974   Feistel (Continued)

FOREIGN PATENT DOCUMENTS

EP   0709776   5/1996

(Continued)

OTHER PUBLICATIONS

Office Action in Japanese Patent Application No. 2006-041559; Mailed Dec. 11, 2007. English Translation Available.

(Continued)

*Primary Examiner*—Stephen M Baker

(57) ABSTRACT

A semiconductor device has multilevel memory cells, each cell storing at least three levels of data each. At least a first data composed of first data bits and a second data composed of second data bits are arranged in order that at least a bit of an N-order of the first bits and a bit of the N-order of the second bits are stored in one of the cells, the N being an integral number. A voltage corresponding to the N-order bits is generated and applied to the one of the cells in response to an address information corresponding thereto. Another semiconductor device has multilevel memory cells arranged so as to correspond to a physical address space, each cell storing $2^n$ levels of data each expressed by n ($n \geq 2$) number of bits (X1, X2, ..., Xn). A logical address is converted into a physical address of the physical address space. Judging is made whether a logical address space including the logical address matches the physical address space. When matched, the most significant bit X1 is specified once using a reference value. The specified bit is output from one of the cells corresponding to the physical address. If not matched, the bits (X2, ..., Xn) are specified by n—time specifying operation maximum using maximum n number of different reference values. The data writing/reading operations to/from the semiconductor devices can be stored in a computer readable medium as program codes for causing a computer to execute these operations.

18 Claims, 10 Drawing Sheets

U.S. PATENT DOCUMENTS

| | | | |
|---|---|---|---|
| 4,004,089 A | 1/1977 | Richard et al. | |
| 4,484,025 A | 11/1984 | Ostermann et al. | |
| 4,661,929 A | 4/1987 | Aoki et al. | |
| 4,701,884 A | 10/1987 | Aoki et al. | |
| 4,751,733 A | 6/1988 | Delayaye et al. | |
| 4,771,404 A | 9/1988 | Mano et al. | |
| 4,899,313 A | 2/1990 | Kumanoya et al. | |
| 4,914,697 A | 4/1990 | Dabbish et al. | |
| 4,984,204 A | 1/1991 | Sato et al. | |
| 5,012,448 A | 4/1991 | Matsuoka et al. | |
| 5,193,173 A | 3/1993 | Seto | |
| 5,257,361 A | 10/1993 | Doi et al. | |
| 5,450,363 A | 9/1995 | Christopherson et al. | |
| 5,452,442 A | 9/1995 | Kephart | |
| 5,497,119 A | 3/1996 | Tedrow et al. | |
| 5,537,540 A | 7/1996 | Miller et al. | |
| 5,553,020 A | 9/1996 | Keeney et al. | |
| 5,574,879 A | 11/1996 | Wells et al. | |
| 5,581,703 A | 12/1996 | Baugher et al. | |
| 5,640,350 A | 6/1997 | Iga | |
| 5,666,411 A | 9/1997 | McCarty | |
| 5,680,343 A | 10/1997 | Kamaya | |
| 5,684,736 A | 11/1997 | Chan | |
| 5,692,047 A | 11/1997 | McManis | |
| 5,715,274 A | 2/1998 | Rostoker et al. | |
| 5,734,869 A | 3/1998 | Chen | |
| 5,745,734 A | 4/1998 | Craft et al. | |
| 5,748,546 A | 5/1998 | Bauer et al. | |
| 5,749,095 A | 5/1998 | Hagersten | |
| 5,752,035 A | 5/1998 | Trimberger | |
| 5,754,566 A * | 5/1998 | Christopherson et al. | ... 714/773 |
| 5,760,725 A | 6/1998 | Yioshida et al. | |
| 5,761,222 A | 6/1998 | Baldi | |
| 5,777,307 A | 7/1998 | Yamazaki | |
| 5,805,712 A | 9/1998 | Davis | |
| 5,815,439 A | 9/1998 | Korsh et al. | |
| 5,835,592 A | 11/1998 | Chang et al. | |
| 5,838,610 A | 11/1998 | Hashimoto | |
| 5,844,841 A | 12/1998 | Takeuchi et al. | |
| 5,847,577 A | 12/1998 | Trimberger | |
| 5,859,795 A | 1/1999 | Rolandi | |
| 5,867,507 A | 2/1999 | Beebe et al. | |
| 5,890,189 A | 3/1999 | Nozue et al. | |
| 5,896,339 A | 4/1999 | McLaury | |
| 5,896,340 A | 4/1999 | Wong et al. | |
| 5,896,574 A | 4/1999 | Bass, Sr. | |
| 5,898,783 A | 4/1999 | Rohrbach | |
| 5,918,008 A | 6/1999 | Togawa et al. | |
| 5,943,693 A | 8/1999 | Barth | |
| 5,963,980 A | 10/1999 | Coulier et al. | |
| 6,023,781 A | 2/2000 | Hazama | |
| 6,089,460 A | 7/2000 | Hazama | |
| 6,260,172 B1 | 7/2001 | Hazama | |
| 6,483,742 B1 | 11/2002 | Sweha et al. | |
| 6,483,743 B1 * | 11/2002 | Talreja | ... 365/185.03 |
| 6,587,373 B2 * | 7/2003 | Talreja | ... 365/185.03 |
| 6,674,385 B2 * | 1/2004 | Micheloni et al. | ... 341/155 |
| 6,707,713 B1 * | 3/2004 | Parker et al. | ... 365/185.03 |
| 6,853,581 B2 | 2/2005 | Hazama | |
| 6,857,099 B1 | 2/2005 | Hazama | |
| 6,895,543 B2 | 5/2005 | Hazama | |
| 7,096,406 B2 * | 8/2006 | Kanazawa et al. | ... 714/763 |
| 7,139,895 B2 | 11/2006 | Hazama | |
| 7,149,940 B2 | 12/2006 | Hazama | |
| 7,577,880 B2 * | 8/2009 | Hazama | ... 714/701 |
| 2001/0019500 A1 | 9/2001 | Banks | |
| 2002/0034097 A1 | 3/2002 | Banks | |
| 2005/0286336 A1 | 12/2005 | Harari et al. | |
| 2007/0130440 A1 | 6/2007 | Hazama | |
| 2007/0168769 A1 | 7/2007 | Hazama | |
| 2007/0168784 A1 | 7/2007 | Hazama | |

FOREIGN PATENT DOCUMENTS

| | | |
|---|---|---|
| EP | 0 725 403 | 8/1996 |
| JP | 60-163300 | 8/1985 |
| JP | 63-070355 | 3/1988 |
| JP | 63-293637 | 11/1988 |
| JP | 02-138367 | 5/1990 |
| JP | 03-189836 | 8/1991 |
| JP | 04-011420 | 1/1992 |
| JP | 04-232588 | 8/1992 |
| JP | 6-195987 | 7/1994 |
| JP | 07-029382 | 1/1995 |
| JP | 07-168750 | 7/1995 |
| JP | 7-201189 | 8/1995 |
| JP | 08-077035 | 3/1996 |
| JP | 11-112571 | 4/1999 |
| WO | 95/34074 | 12/1995 |

OTHER PUBLICATIONS

"A multilevel-cell 32 Mb flash memory" by Baue et al. This paper appears in: Solid-State Circuits Conference, 1995. Digest of Technical Papers. 42nd ISSCC, 1995 IEEE International Publication Date: Feb. 15-17, 1995 On pp. 132-133, 351 ISBN: 0-7803-2495-1 INSPEC Accession No. 5125069.

Decision on Appeal; Japanese Patent Application No. 9-257561; Appeal No. 2005-19741; Dated May 8, 2008.

Concise Explanation of Non-English Language Documents Under 37 C.F.R. § 1.98(a)(3).

* cited by examiner

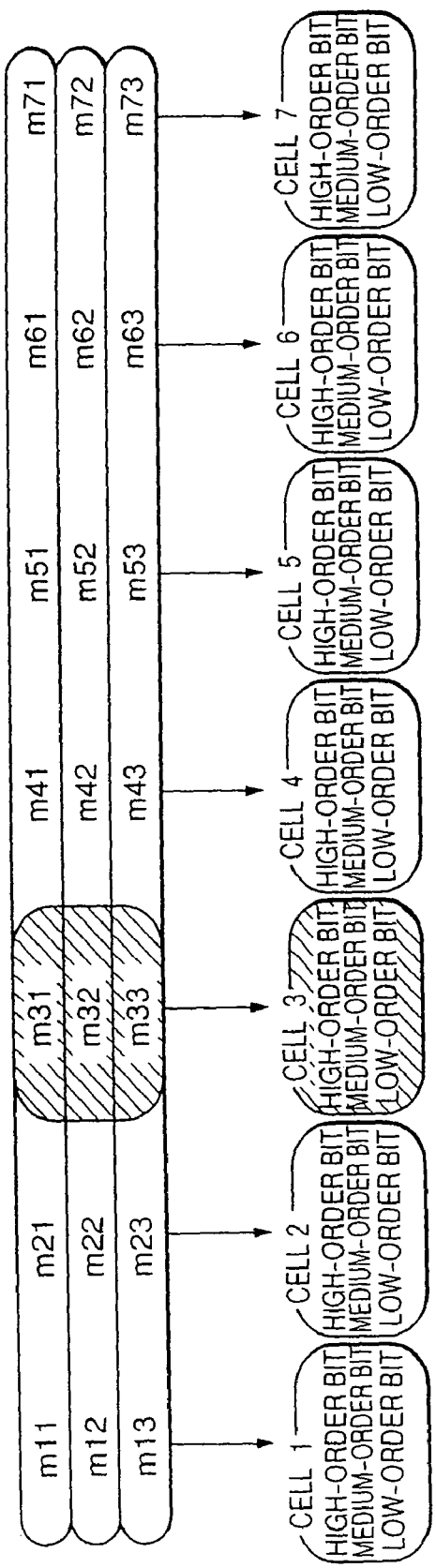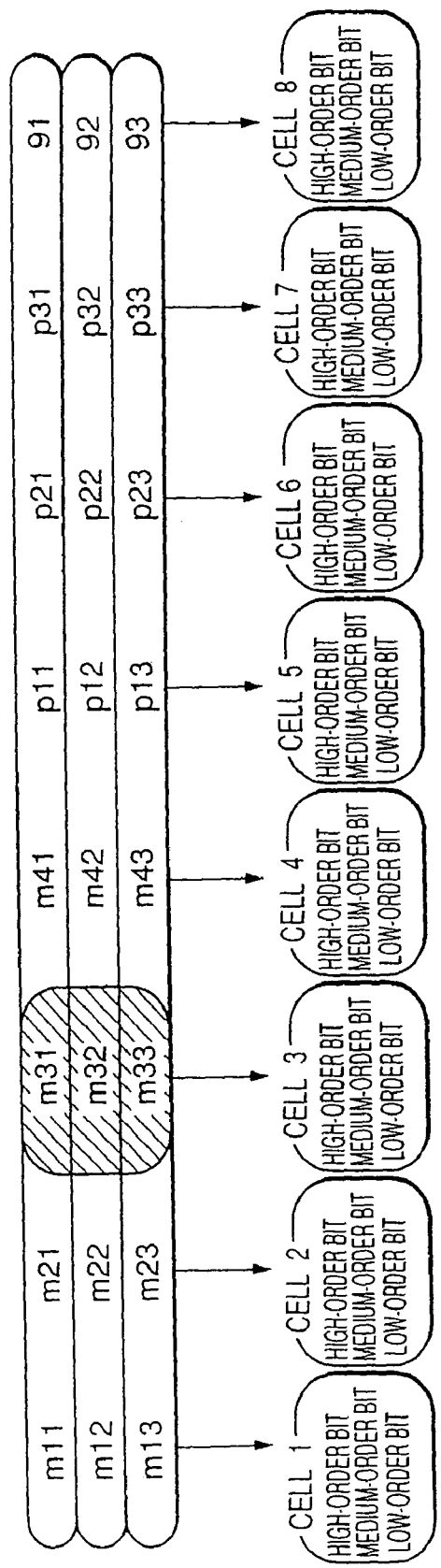
FIG.5A
FIG.5B

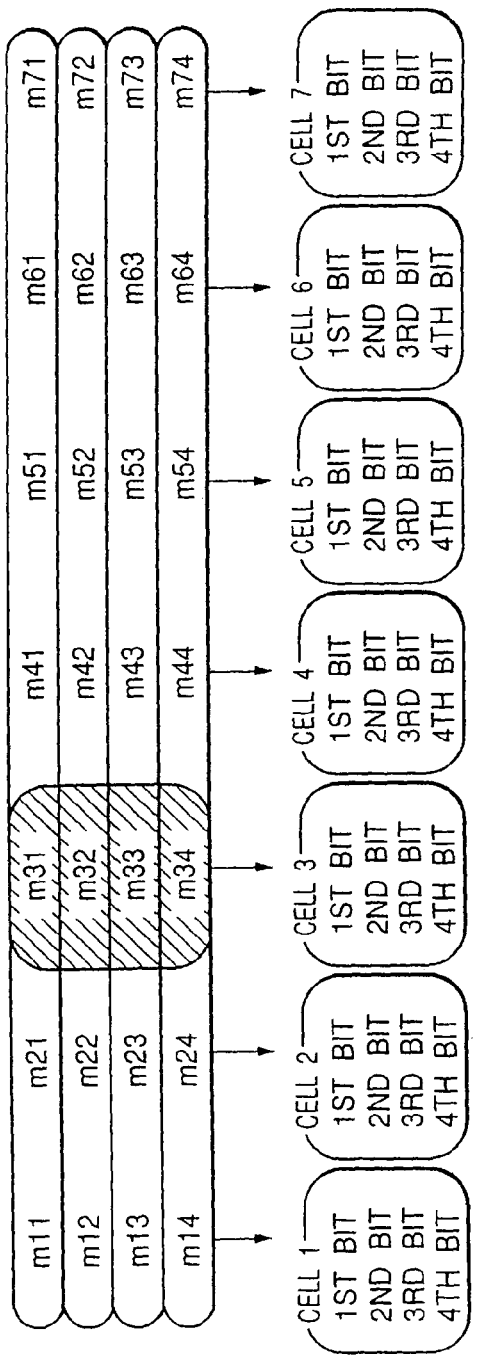
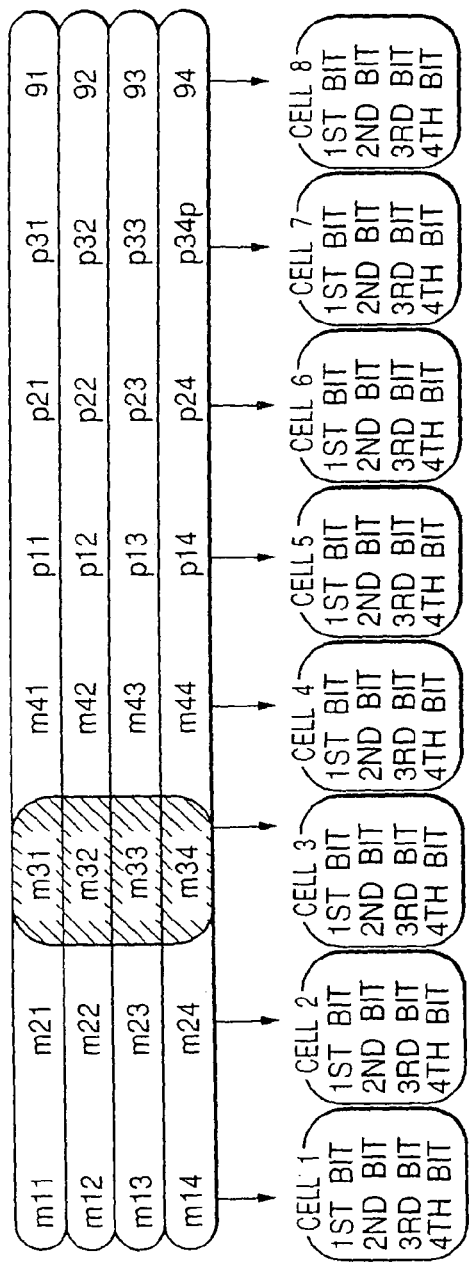
FIG.7A
FIG.7B

MULTILEVEL SEMICONDUCTOR MEMORY, WRITE/READ METHOD THERETO/THEREFROM AND STORAGE MEDIUM STORING WRITE/READ PROGRAM

This application is a continuation of U.S. patent application Ser. No. 10/642,764, entitled "Multilevel Semiconductor Memory, Write/Read Method Thereto/Therefrom And Storage Medium Storing Write/Read Program", filed Aug. 19, 2003 now U.S. Pat. No. 7,139,895, which is a divisional of U.S. patent application Ser. No. 09/438,295, entitled "Multilevel Semiconductor Memory, Write/Read Method Thereto/Therefrom And Storage Medium Storing Write/Read Program", filed Nov. 12, 1999, now U.S. Pat. No. 6,857,099, which is a divisional of U.S. patent application Ser. No. 08/931,519, entitled "Multilevel Semiconductor Memory, Write/Read Method Thereto/Therefrom And Storage Medium Storing Write/Read Program", filed Sep. 16, 1997, now U.S. Pat. No. 6,023,781, and also claims the benefit of priority Japanese patent application serial no. 342663, filed Dec.; 6, 1996, and Japanese patent application serial no. 267844, filed Sep. 18, 1996.

BACKGROUND OF THE INVENTION

The present invention relates to a multilevel semiconductor memory device, data writing/reading methods thereto/therefrom, and a storage medium storing data writing/reading programs.

As an error correction function of codes stored in a semiconductor memory device, a method of using Hamming codes has been used. In the semiconductor memory device using the Hamming codes, when four-bit data ($m1$, $m2$, $m3$, $m4$), for instance is required to be stored, three-check bits ($p1$, $p2$, $p3$) are obtained by a coder, and seven bits in total of the four data bits and the three check bits are stored.

When the Hamming codes stored in the semiconductor memory device are read, the read data ($y1$, $y2$, $y3$, $y4$, $y5$, $y6$, $y7$) is given to a decoder to obtain error-corrected data ($m1$, $m2$, $m3$, $m4$). In the above-mentioned semiconductor memory device, it is possible to correct an error of one bit of the read data ($y1$, $y2$, $y3$, $y4$, $y5$, $y6$, $y7$). For further detail, refer to [Coding Theory] by Hideki IMAI, published by Electronic Information Communications Institute (Ver. 5), Jun. 10, 1994, for instance.

Recently, however, as disclosed by Japanese Laid-Open Patent No. 6(1994)-195987, there has been developed a multilevel semiconductor memory device which can store three or more levels of data each in a single memory cell. A plurality of threshold voltages are set in the multilevel semiconductor memory device. For instance, in the case of four-level nonvolatile semiconductor memory, four threshold voltages (0V, 2V, 4V, 6V) are set to each memory cell, respectively, so that two-bit data can be stored in a single memory cell. In other words, the threshold voltage of the memory cell is set to any one of 0V, 2V, 4V and 6V in correspondence to each of four storage contents of (00, 01, 10, 11).

Here, when the error correction function based upon the Hamming codes is provided for the multilevel semiconductor memory device, bits of a code train obtained by the coding are stored in sequence and two adjacent bits are stored in the same memory cell.

For instance, the case where check bits ($p11$, $p21$, $p31$) and ($p12$, $p22$, $p32$) are obtained on the basis of data bits ($m11$, $m21$, $m31$, $m41$) and (($m12$, $m22$, $m32$, $m42$) and further these bits are stored in the multilevel memory cell will be explained hereinbelow. That is, when the Hamming codes composed of these data bits and these check bits are stored in the multilevel memory cell, these bits have been stored in the order of ($m11$, $m21$), ($m31$, $m41$), ($p11$, $p21$), ($p31$, $m12$), ($m22$, $m32$), ($m42$, $p2$), and ($p22$, $p32$).

Here, the way of producing an error in the multilevel semiconductor memory devices will be explained hereinbelow by taking the case of the multilevel non-volatile memory. In this case, since an error occurs due to change in threshold voltage, there exists a high possibility that an error occurs in two-bit data at the same time; that is, for example, "10" is changed to "01".

In other words, the errors caused in the multilevel semiconductor memory device are characterized in that errors occur concentrically in an interval of a code series according to the number of levels to be stored in a single multilevel memory cell. This is referred to as burst error. When this burst error occurs, the storage status of a single multilevel memory cell changes, and thus two-bit error occurs. In this case, since two or more errors occur in a single Hamming code, there exists a problem in that the code cannot be decoded correctly.

As another method, other than the one using the Hamming code, Japanese Patent Laid-Open No. 60(1985)-163300 discloses an error correction method for a multilevel semiconductor memory device that uses multiple codes. In this method, however, the fact that burst errors occur with a high possibility in the case of the multilevel semiconductor memory device is not considered. Thus, there exists a problem in that the error correction efficiency is not high.

Further, in the multilevel memory cell, there exists another problem in that the number of read operations required for a single memory cell increases. Here, a data reading method will be explained hereinbelow by taking the case of the read operation required for the four-level semiconductor memory device. In the semiconductor memory device, when receiving an external read instruction, the memory device waits an input address. In this case, the input address is a logical address not a physical address corresponding to an actual memory cell. The physical address is thus calculated on the basis of the input logical address.

Successively, on the basis of the calculated physical address, it is checked whether the threshold voltage of the designated memory cell is set to any one of 0V, 2V, 4V and 6V. The checked threshold voltage is then converted into two-bit data. In practice, reference voltages (e.g., 1V, 3V and 5V) are applied in sequence to the memory cell. In this case, when the reference voltage of 1V is applied, if a current flows through the source and drain of the memory cell, the threshold voltage of the memory cell is decided as being 0V, so that "00" data can be read. On the other hand, although a current does not flow at 1V, when a current flows at 3V, the threshold voltage of the memory cell is decided as being 2V, so that "01" data can be-read. Further, although the current does not flow at 1V and 3V, when a current flows at 5V, the threshold voltage of the memory cell is decided as being 4V, so that "10" data can be read. Further, when the current does not flow at all the voltages applied to the memory cell, the threshold voltage of the memory cell is decided as 6V, so that "11" is read. In the example, although four levels are set to a single memory cell; that is, two-bit data are stored, the method of writing and reading multilevel data (more than two) has been studied.

In the case of the multilevel memory cell, however, there exists a problem in that the number of read operations required for a single memory cell increases.

For instance, when four levels are stored in a single memory cell as described above, in the four-level semiconductor memory device, three read and check operations must be always executed to specify to which level of the four levels the threshold voltage of the memory cell belongs in each read operation, irrespective of the input address. In practice, although the read and check operations are executed by applying 1V, 3V and 5V stepwise to the memory cell, this is the same as that three read and check operations are necessary.

To overcome this problem, the Inventors have already proposed a method of increasing the read operation speed of the memory cell, in Japanese Patent Laid-Open No. 7(1995)-201189. When this method is explained in correspondence to the four-level semiconductor device, first 3V is applied to the memory cell, and then the high-order bit of the two-bit data is decided according to whether a current flows or not. In this case, when a current flows, the high-order bit is decided as "0", and when the current does not flow, the high-order bit is decided as "1". Successively, when the high-order bit is decided as "0", 1V is further applied to the memory cell. When a current flows, the two-bit data of the memory cell is decided as "00", and when the current does not flow, the data is decided and output as "01". On the other hand, when the high-order bit is decided as "1", 5V is further applied to the memory cell. When a current flows, the two-bit data of the memory cell is decided as "10", and when the current does not flow, the data is decided and output as "11". As described above, in this data reading method proposed by the Inventors, it is possible to specify two-bit data stored in a single memory cell by two read operations.

In this data reading method, however, it is always necessary to specify to which level of the four levels the threshold voltage of the memory cell belongs, irrespective of the logical address; that is, even when the logical address designates the high-order bit of the memory cell.

As described above, in the multilevel semiconductor memory device, data are output after the data stored in the memory cell has been perfectly specified in the read operation, irrespective of the input logical address. There exists a problem in that a time longer than necessity is needed, with the result that the data reading speed is inevitably limited.

SUMMARY OF THE INVENTION

With these problems in mind, therefore, it is the object of the present invention to provide a multilevel semiconductor memory device, writing/reading methods thereto/therefrom and a storage medium storing writing/reading programs which can execute the error correction effectively, even if the multilevel data stored in a single memory cell is lost.

Further, another object of the present invention is to provide a multilevel semiconductor memory device, writing/reading methods thereto/therefrom and a storage medium storing writing/reading programs, which can read data of high access frequency at a high speed on the basis of the input logical address, to further shorten the access time required in the read operation.

The present invention provides a semiconductor device comprising: a plurality of multilevel memory cells, each cell storing at least three levels of data each; arranging means for accepting at least a first data composed of a plurality of first data bits and a second data composed of a plurality of second data bits, the first and the second data being coded by a coding method, and for arranging the first and the second data bits in order that at least a bit of an N-order of the first data bits and a bit of the N-order of the second data bits are stored in one of the cells, the N being an integral number; generating means for generating at least a voltage corresponding to the N-order bits; and applying means for applying the voltage to the one of the cells in response to an address information corresponding to the one of the cells.

Further, the present invention provides a method of writing data of bits in a semiconductor device having a plurality of multilevel memory cells, each cell storing at least three levels of data each, comprising the steps of: entering at least a first data composed of a plurality of first data bits and a second data composed of a plurality of second data bits, the first and the second data being coded by a coding method; arranging the first and the second data bits such that at least a bit of an N-order of the first data bits and a bit of the N-order of the second data bits are stored in one of the cells, the N being an integral number; generating at least a voltage corresponding to the N-order bits; and applying the voltage to the one of the cells in response to an address information corresponding to the one of the cells.

Further, the present invention provides a computer readable medium storing program code for causing a computer to write data of bits in a semiconductor device having a plurality of multilevel memory cells, each cell storing at least three levels of data each, comprising: first program code means for entering at least a first data composed of a plurality of first data bits and a second data composed of a plurality of second data bits, the first and the second data being coded by a coding method; and second program code means for arranging the first and the second data bits such that at least a bit of an N-order of the first data bits and a bit of the N-order of the second data bits are stored in one of the cells, the N being an integral number.

Further, the present invention provides a semiconductor device comprising: converting means for converting a logical address into a physical address; a plurality of multilevel memory cells arranged so as to correspond to a physical address space including the physical address, each cell storing $2^n$ levels of data each expressed by n ($n \geq 2$) number of bits (X1, X2, . . . , Xn); judging means for judging whether a logical address space including the logical address matches the physical address space; specifying means for specifying the most significant bit X1, by one-time specifying operation, by means of a reference value when the logical address space matches the physical address space; and outputting means for outputting the specified bit from one of the cells corresponding to the physical address.

Further, the present invention provides a method of reading n ($n \geq 2$) number of bits (X1, X2, . . . , Xn) from a plurality of multilevel memory cells arranged so as to correspond to a physical address space, each cell storing $2^n$ levels of data each expressed by the bits (X1, X2, . . . , Xn), comprising the steps of: converting a logical address into a physical address included in the physical address space; judging whether a logical address space including the logical address matches the physical address space; specifying the most significant bit X1, by one-time specifying operation, by means of a reference value when judged that the logical address space matches the physical address space; and outputting the specified bit from one of the cells corresponding to the physical address.

Further, the present invention provides a method of reading n ($n \geq 2$) number of bits (X1, X2, . . . , Xn) from a plurality of multilevel memory cells arranged so as to correspond to a physical address space, each cell having at least one transistor, each cell storing $2^n$ levels of data each expressed by the bits (X1, X2, . . . , and Xn), comprising the steps of: converting a logical address into a physical address included in the physical address space; judging whether a logical address space including the logical address matches the physical address space; specifying the most significant bit X1 by applying a predetermined reference voltage to a gate of the transistor to determine whether a current flows between a source and a drain of the transistor when the logical address space matches the physical address space; and outputting the specified bit from one of the cells corresponding to the physical address.

Further, the present invention provides a method of reading n (n≧2) number of bits (X1, X2, . . . , Xn) from a plurality of multilevel memory cells arranged so as to correspond to a physical address space, each cell having at least one transistor, each cell storing $2^n$ levels of data each expressed by the bits (X1, X2, . . . , and Xn), comprising the steps of: converting a logical address into a physical address included in the physical address space; judging whether a logical address space including the logical address matches the physical address space; specifying the most significant bit X1 by comparing an output voltage of the transistor corresponding to the most significant bit with a reference voltage when the logical address space matches the physical address space; and outputting the specified bit from one of the cells corresponding to the physical address.

Further, the present invention provides a computer readable medium storing program code for causing a computer to read n (n≧2) number of bits (X1, X2, . . . , Xn) from a plurality of multilevel memory cells arranged so as to correspond to a physical address space, each cell storing $2^n$ levels of data each expressed by the bits (X1, X2, . . . , Xn), comprising: first program code means for converting a logical address into a physical address included in the physical address space; second program code means fop judging whether a logical address space including the logical address matches the physical address space; third program code means for specifying the most significant bit X1, by one-time specifying operation, by means of a reference value when judged that the logical address space matches the physical address space; and fourth program code means for outputting the specified bit from one of the cells corresponding to the physical address.

Further, the present invention provides a computer readable medium storing program code for causing a computer to read n (n≧2) number of bits (X1, X2, . . . , Xn) from a plurality of multilevel memory cells arranged so as to correspond to a physical address space, each cell having at least one transistor, each cell storing $2^n$ levels of data each expressed by the bits (X1, X2, . . . , Xn), comprising: first program code means for converting a logical address into a physical address included in the physical address space; second program code means for judging whether a logical address space including the logical address matches the physical address space; third program code means for specifying the most significant bit X1 by applying a reference voltage to a gate of the transistor when the logical address space matches the physical address space to determine whether a current flows between a source and a drain of the transistor; and fourth program code means for outputting the specified bit from one of the cells corresponding to the physical address.

Further, the present invention provides a computer readable medium storing program code for causing a computer to read n (n≧2) number of bits (X1, X2, . . . , Xn) from a plurality of multilevel memory cells arranged so as to correspond to a physical address space, each cell having at least one transistor, each cell storing $2^n$ levels of data each expressed by the bits (X1, X2, . . . , Xn), comprising: first program code means for converting a logical address into a physical address included in the physical address space; second program code means for judging whether a logical address space including the logical address matches the physical address space; third program code means for specifying the most significant bit X1 by comparing an output voltage of the transistor corresponding to the most significant bit with a reference voltage when the logical address space matches the physical address space; and fourth program code means for outputting the specified bit from one of the cells corresponding to the physical address.

Further, the present invention provides a semiconductor device having a plurality of multilevel memory cells, each cell storing one of at least three levels of data each, the semiconductor device comprising a bit disperser for dispersing bits over the plurality of multilevel memory cells to store the bits therein, the bits constituting at least one code data coded by a coding method to be stored in the cells.

Further, the present invention provides a computer readable medium storing program code for causing a computer to store data in a semiconductor device having a plurality of multilevel memory cells, each cell storing one of at least three levels of data each, comprising a program code means for dispersing bits over the plurality of multilevel memory cells to store the bits therein, the bits constituting at least one code data coded by a coding method to be stored in the cells.

Further, the present invention provides a method of writing at least one code data coded by a coding method in a semiconductor device having a plurality of multilevel memory cells, each cell storing one of at least three levels of data each, the method comprising the step of dispersing bits constituting the code data over the plurality of multilevel memory cells.

Further, the present invention provides a computer readable medium storing program code for causing a computer to write at least one code data coded by a coding method in a semiconductor device having a plurality of multilevel memory cells, each cell storing one of at least three levels of data each, comprising the program code for dispersing bits constituting the code data over the plurality of multilevel memory cells.

Further, the present invention provides a semiconductor device comprising: inputting means for inputting a logical address; converting means for converting the logical address into a physical address; a plurality of multilevel memory cells arranged so as to correspond to physical addresses, each cell storing at least three levels of data each, the data being expressed by data components of two-dimension or more; controlling means for selecting one of the cells corresponding to the physical address and designating one of the data components in accordance with the logical address; and outputting means for outputting the designated data component, wherein the semiconductor device has a judging value, for specifying, by one-time specifying operation, at least one of the data components, and when the logical address is included in an address space A1 that corresponds to an address space including the physical address, the controlling means specifies the designated data component by means of the judging value, thus the specified data being output by the outputting means.

Further, the present invention provides a method of reading data stored in a semiconductor device having at least one multilevel memory cell provided so as to correspond to a physical addresses converted from an input logical address, the cell having a control gate, a source and a drain, the cell storing at least three levels of data each, the data being expressed by data components of two-dimension or more; comprising the steps of: preparing a judging value for specifying at least one of the data components; and applying a voltage corresponding to the judging value to the control gate to determine whether a current flows between the source and the drain when the logical address is included in an address space A1 that corresponds to an address space including the physical address.

Further, the present invention provides a computer readable medium storing program code for causing a computer to read data stored in a semiconductor device having at least one multilevel memory cell provided so as to correspond to a physical addresses converted from an input logical address, the cell having a control gate, a source and a drain, the cell storing at least three levels of data each, the data being expressed by data components of two-dimension or more; comprising: first program code means for preparing a judging value for specifying at least one of the data components; and second program code means for applying a voltage corresponding to the judging value to the control gate to determine whether a current flows between the source and the drain when the logical address is included in an address space A1 that corresponds to an address space including the physical address.

Further, the present invention provides a semiconductor device comprising: a plurality of multilevel memory cells, each cell storing one of at least three different levels of data each; first coding means for converting, by a coding method, a first data into a first code composed of at least two-digit code components; second coding-means for converting, by a coding method, a second data into a second code composed of at least two-digit code components; and arranging means for arranging the code components in order to store at least two pairs of code components in corresponding cells, each pair having a code component of the first code and a code component of the second code of a same digit.

Further, the present invention provides a semiconductor device comprising: a plurality of multilevel memory cells, each cell storing one of at least three different levels of data each; coding means for converting input data into a code of at least two digits by a coding method; and separating means for separating the code by a specific number of digits into at least a first and a second block of code components to store at least a code component group in at least one of the cells, the group having a code component of the first block and a code component of the second block of a same digit.

According to the present invention, when an error occurs in multilevel data stored in a single multilevel memory cell, data of the minimum number of error-correctable bits is lost in one code, it is possible to execute the error correction effectively.

Further, according to the present invention, logical addresses are divided hieratically into an address space of relatively high access speed and another address space of relatively low access speed. And, a partial space one-to-one corresponding to the address space formed by physical addresses is determined as the address space of relatively high access speed. Further, data in the address space of relatively high access speed is stored in the specific component, for example the high-order bit, in each memory cell. This data is judged by use of one judging value.

When the input logical address is included in the partial space, this logical address designates the high-order bit data. It is thus possible to immediately detects the high-order bit data by a single decision process by use of judging value. It is thus possible to read data from the semiconductor device with multilevel memory cells in an extremely high efficiency by storing data of the highest access frequency and data of a relatively low access frequency in the high- and the low-order bit, respectively in each cell.

BRIEF DESCRIPTION OF THE DRAWINGS

FIGS. 5A and 5B are illustrations for assistance in explaining the modifications of the second embodiment of the method of data writing according to the present invention;

FIGS. 7A and 7B are illustrations for assistance in explaining the modifications of the third embodiment of the method of data writing according to the present invention;

DETAILED DESCRIPTION OF THE PREFERRED EMBODIMENTS

Embodiments of the multilevel semiconductor memory device, the methods of writing/reading data from/to the memory device, and the storage medium storing the data writing/reading programs according to the present invention will be described hereinbelow with reference to the attached drawings.

Figure 1:
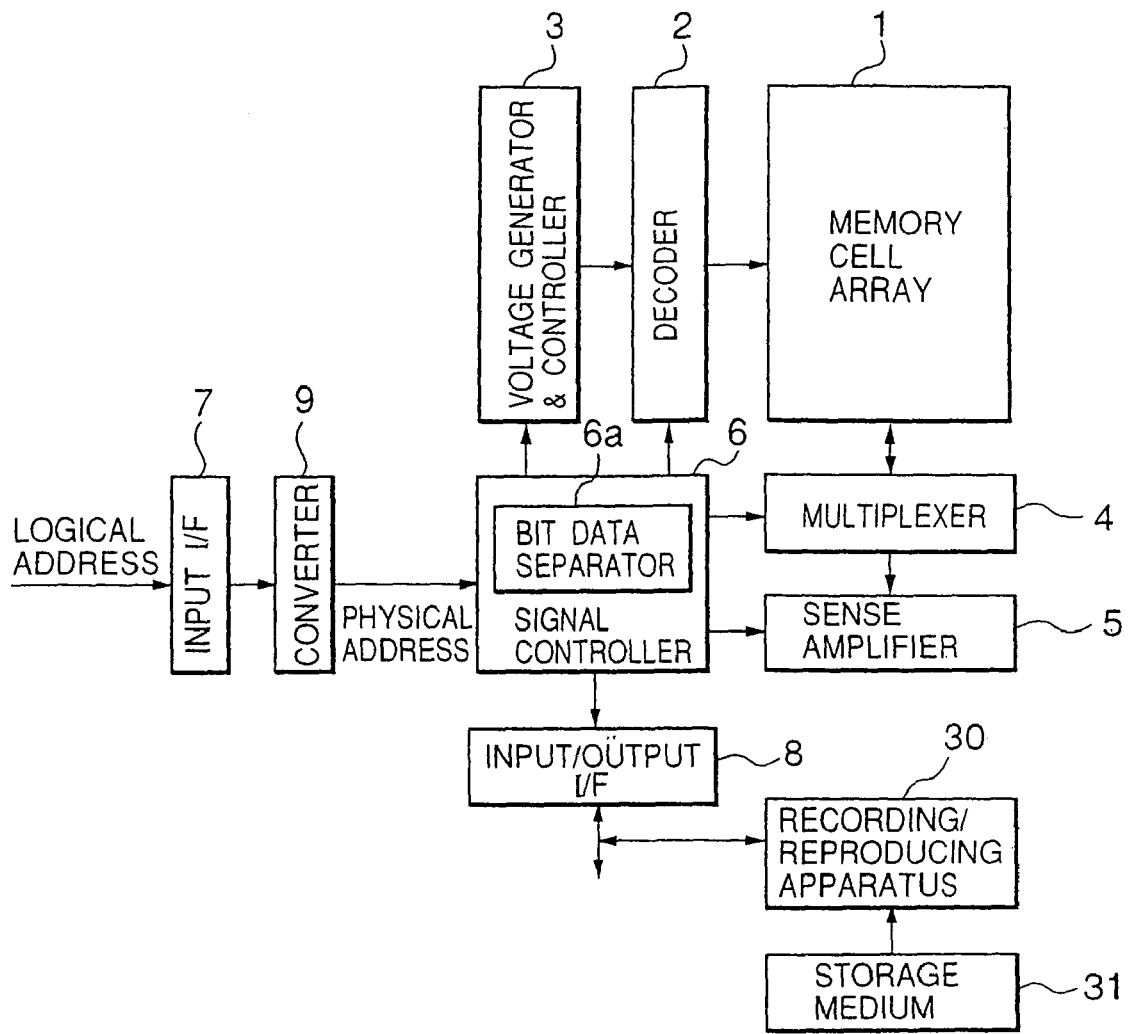
FIG. 1 is a block diagram showing a main configuration of an EEPROM in the preferred embodiments according to the present invention.
Figure 2:
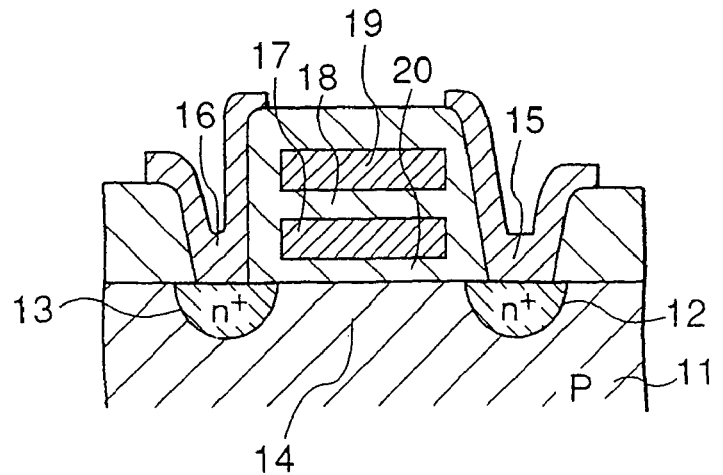
FIG. 2 is a schematic cross-sectional view showing a floating-gate type memory cell of the EEPROM in the preferred embodiments according to the present invention.

FIG. 1 shows the essential construction of a multilevel EEPROM (electrically erasable and programmable read only memory), to which embodiments according to the present invention are applied. In FIG. 1, a memory cell array 1 is formed by arranging a plurality of memory cells in a matrix pattern. Each memory cell is of floating gate type, as shown in FIG. 2. In FIG. 2, a drain 12 and a source 13 each formed by an n-type impurity diffusion layer are formed on a surface of a p-type silicon substrate 11. Further, a channel region 14 is formed between the drain 12 and the source 13.

A bit line 15 is connected to the drain 12, and a source line 16 is connected to the source 13. Further, formed on the channel region 14 is a tunnel insulating film 20 formed of $SiO_2$ film and having a thickness of about 10 nm. On this tunnel insulating film 20, there are formed in sequence a floating gate 17 formed of a low-resistance polysilicon, an interlayer insulating film 18, and a control gate (word line) 19 formed of a low-resistance polysilicon.

The word line 19 is connected to a decoder 2 provided as extending in the column direction of the memory cell array 1. The bit line 15 is connected to a multiplexer 4 provided as extending in the row direction of the memory cell array 1. And, the source line 16 is grounded.

When data are written in the multilevel EEPROM as described above, the operation mode is set to a program mode. Further, data are input through an input/output interface (I/F) 8; on the other hand, addresses are input through an input interface I/F 7. Each input address is a logical address and hence converted into a physical address by a converter 9.

The data input through the input I/F 8 are given to a signal controller 6. The bit data of the given data are rearranged by a bit data separator 6a provided in the signal controller 6, as described in further detail later.

The input data whose bits are rearranged are given to a voltage generator and controller 3, to generate voltages according to the bit data. The voltages generated as described above are applied to the memory cell array 1 through a decoder 2, so that predetermined threshold voltages are set to the memory cells.

The first embodiment of the method of data writing according to the present invention will be described hereinbelow with reference to FIG. 3.

The multilevel EEPROM described in this embodiment is a four-level memory device, in which the threshold voltage of each memory cell is set to any of the four values (0V, 2V, 4V, 6V) corresponding to each of two-bit data (00, 01, 10, 11) to be stored. Employed in this EEPROM is the method of interleaving, by m-times, a code C having a code length n and a burst error correction capability L, as the burst error correction code.

In data rewriting, whenever 8-bit data are input, the input data is divided into 4×2 data bits as (m11, m21, m31, m41) and (m12, m22, m32, m42). On the basis of the divided data bits, 3×2 check bits (p11, p21, p31) and (p12, p22, p32) are formed.

Further, on the basis of these data bits (m11, m21, m31, m41) and (m12, m22, m32, m42) and the check bits (p11, p21, p31) (p12, p22, p32), two code words (m11, m21, m31, m41, p11, p21, p31) and (m12, m22, m32, m42, p12, p22, p32) are formed.

Figure 3:
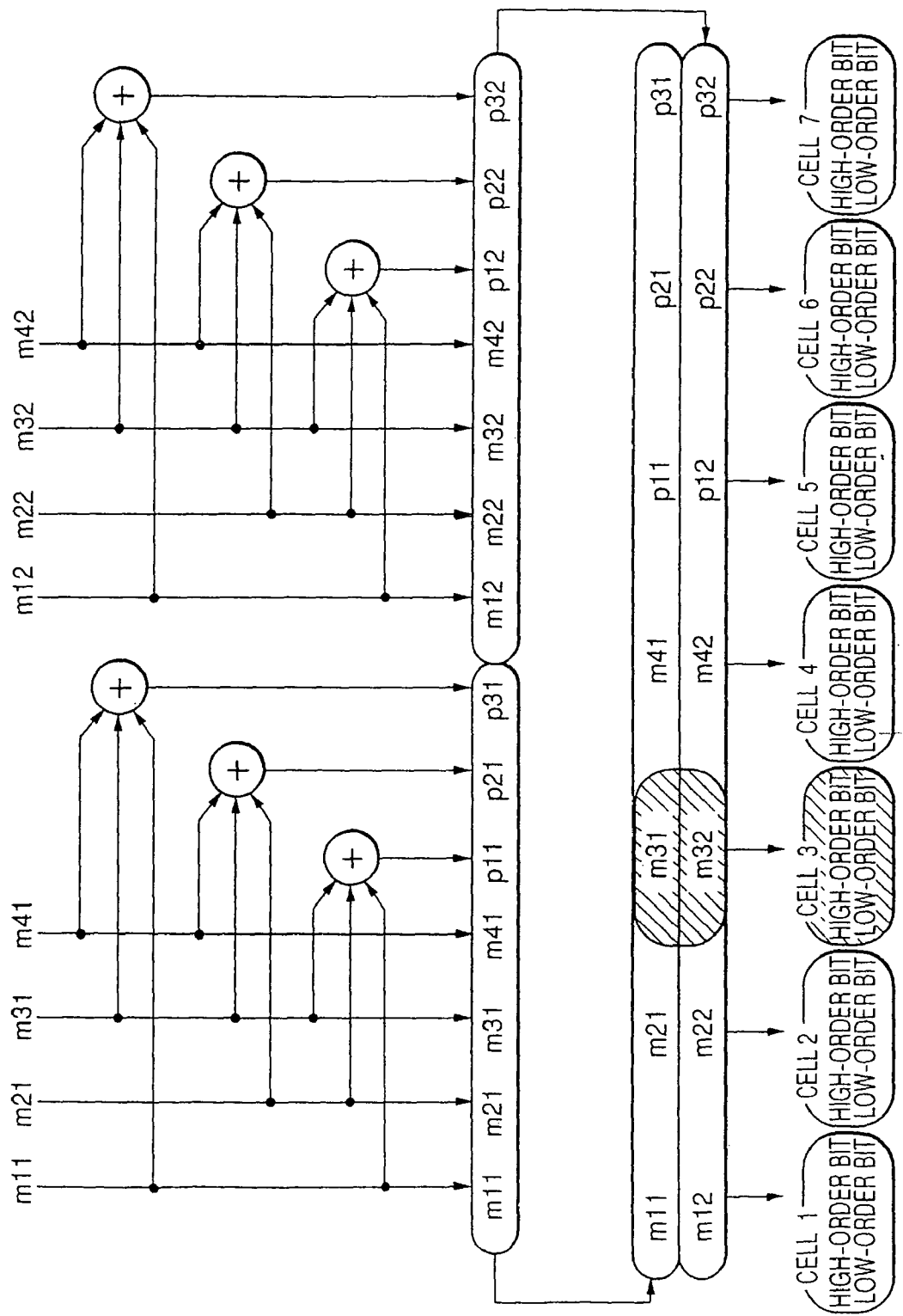
FIG. 3 is an illustration for assistance in explaining the first embodiment of the method of data writing according to the present invention.

The two code words formed as described above are given to the bit data separator 6a, and then the bits of the code words are put in the positions of 2×7 arrangement as shown in FIG. 3. Further, combinations of (m11, m12), (m21, m22), (m31, m32), (m41, m42), (p11, p12), (p21, p22) and (p31, p32) are sequentially stored in the seven memory cells.

Accordingly, in FIG. 3, m11 and m12 are stored in the memory cell 1 as the high- and the low-order bit, respectively. In the same way, m21 and m22; m31 and m32; m41 and m42; p11 and p12; p21 and p22; and p31 and p32 are stored in the memory cells 2 to 7, respectively.

As described later in further detail, each code word can be corrected even if a single error occurs. For instance, as shown in FIG. 3, even if the threshold voltage of the third memory cell 3 changes and thereby a burst error of two-bit length occurs, since this error is a single error in a single code word, the correction is enabled. In other words, even if the threshold voltage of one of the seven memory cells changes; that is, even when a burst error such that the stored contents "01" change to "10" occurs, for instance, the correction is enabled.

The second embodiment of the method of data writing according to the present invention will be described hereinbelow.

The semiconductor device applied with the second embodiment is an eight-level memory device, in which the threshold voltage of each memory cell is set to any of eight levels (0V, 1V, 2V, 3V, 4V, 5V, 6V, 7V) corresponding to three-bit data (000, 001, 010, 011, 100, 101, 110, 111) to be stored.

In data rewriting, whenever 12-bit data is input, the input data is divided into 4×3 data bits (m11, m21, m31, m41), (m12, m22, m32, m42) and (m13, m23, m33, m43). On the basis of the divided data bits, 3×3 redundant check bits (p11, p21, p31), (p12, p22, p32) and (p13, p23, p33) are obtained.

On the basis of these data bits and check bits, three code words (m11, m21, m31, m41, p11, p21, p31), (m12, m22, m32, m42, p12, p22, p32) and (m13, m23, m33, m43, p13, p23, p33) are formed in 3×7 arrangement. Further, as shown in FIG. 4, (m11, m12, m13), (m21, m22, m23), (m31, m32, m33), (m41, m42, m43), (p11, p12, p13), (p21, p22, p23) and (p31, p32, p33) are stored in the seven memory cells.

Figure 4:
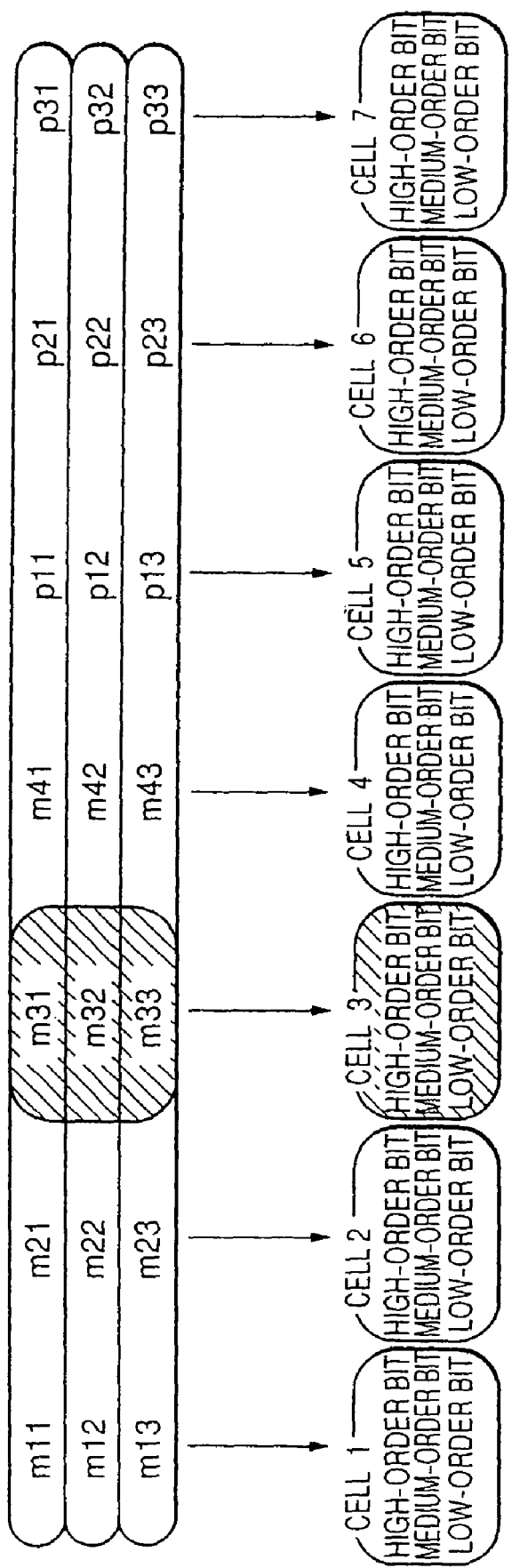
FIG. 4 is an illustration for assistance in explaining the second embodiment of the method of data writing according to the present invention.

Accordingly, in FIG. 4, m11, m12 and m13 are stored in the memory cell 1 as the high-, the medium- and the low-order bit, respectively. In the same way, m21, m22 and m23; m31, m32 and m33; m41, m42 and m43; p11, p12 and p13; p21, p22 and p23; and p31, p32 and p33 are stored in the memory cells 2 to 7, respectively.

Each code word can be corrected even if a single error occurs. For instance, as shown in FIG. 4, even if the threshold voltage of the third memory cell 3 changes and thereby a burst error of three-bit length occurs, since this error is a single error in a single code word, the correction is enabled. In other words, even if the threshold voltage of one of the seven memory cells changes; that is, even when a burst error such that the stored contents "100" change to "011" occurs, for instance, the correction is enabled.

Two modifications of the second embodiment of the method of data writing according to the present invention will be described hereinbelow.

The semiconductor device applied with the first modification is an eight-level memory device, in which the threshold voltage of each memory cell is set to any of eight levels (0V, 1V, 2V, 3V, 4V, 5V, 6V, 7V) corresponding to three-bit data (000, 001, 010, 011, 100, 101, 110, 111) to be stored. The first modification follows a specific linear coding standard in which two errors per bit of a code word can be corrected.

In data rewriting, whenever data composed of a specific number of bits, for example, K bits are input, the input data are divided into three (K/3) data bits. Redundant bits are obtained on the basis of the divided data bits to form a 14-bit code word (m11, m21, m31, m41, m51, m61, m71, m12, m22, m32, m42, m52, m62, m72) and a 7-bit code word (m13, m23, m33, m43, m53, m63, m73). In each code word, a specific number of bits are data bits and the remaining bits are redundant bits for error correction.

Then, the 14-bit code word (m11, m21, m31, m41, m51, m61, m71, m12, m22, m32, m42, m52, m62, m72) is divided into 7-bit code trains (m11, m21, m31, m41, m51, m61, m71) and (m12, m22, m32, m42, m52, m62, m72).

Then, the code train a (m11, m21, m31 m41, m51, m61, m71), the code train b (m12, m22, m32, m42, m52, m62, m72) and one code word c (m13, m23, m33, m43, m53, m63, m73) are put in the positions of 3×7 arrangement. Further, as shown in FIG. 5A, (m11, m12, m13), (m21, m22, m23), (m31, m32, m33), (m41, m42, m43), (m51, m52, m53), (m61, m62, m63) and (m71, m72, m73) are stored in the seven memory cells.

Accordingly, in FIG. 5A, m11, m12 and m13 are stored in the memory cell 1 as the high-, the medium- and the low-order bit, respectively. In the same way, m21, m22 and m23; m31, m32 and m33; m41, m42 and m43; m51, m52 and m53; m61, m62 and m63; and m71, m72 and m73 are stored in the memory cells 2 to 7, respectively.

The code trains a and b, and the code word c can be corrected even if a single error occurs. For instance, as shown in FIG. 5A, even if a burst error of three-bit length occurs in the third memory cell 3, since this error is a single error in the code trains a and b, and the code word c, and this error corresponds to two errors in the code word composed of the code trains a and b, the correction is enabled. In other words, even if the threshold voltage of one of the seven memory cells changes; that is, even when a burst error such that the stored contents "100" change to "011" occurs, for instance, the correction is enabled.

Next, the second modification of the second embodiment of the method of data writing according to the present invention will be described hereinbelow.

The semiconductor device applied with the second modification is an eight-level memory device, in which the threshold voltage of each memory cell is set to any of eight levels (0V, 1V, 2V, 3V, 4V, 5V, 6V, 7V) corresponding to three-bit data (000, 001, 010, 011, 100, 101, 110, 111) to be stored. The second modification follows a specific coding standard in which a single error per bit of a code word can be corrected and two errors per bit of a code word can be detected.

In data rewriting, whenever 12-bit data is input, the input data is divided into 4×3 data bits (m11, m21, m31, m41), (m12, m22, m32, m42) and (m13, m23, m33, m43). By means of Hamming codes, 3×3 redundant bits (p11, p21, p31), (p12, p22, p32) and (p13, p23, p33) are obtained on the basis of the divided data bits.

Then, all the seven bits are EX-ORed in each of the three code trains (m11, m21, m31, m41, p11, p21, p31), (m12, m22, m32, m42, p12, p22, p32) and (m13, m23, m33, m43, p13, p23, p33). The resultant redundant bits q1, q2, and q3 are added to the three code trains, respectively, to form three code words (m11, m21, m31, m41, p11, p21, p31, q1), (m12, m22, m32, m42, p12, p22, p32, q2) and (m13, m23, m33, m43, p13, p23, p33, q3).

Then, the three code words are put in the positions of 3×8 arrangement. Further, as shown in FIG. 5B, (m11, m2, m3), (m21, m22, m23), (m31, m32, m33), (m41, m42, m43), (p11, p2, p3), (p21, p22, p23), (p31, p32, p33) and (q1, q2, q3) are stored in the eight memory cells.

Accordingly, in FIG. 5B, m11, m12 and m13 are stored in the memory cell 1 as the high-, the medium- and the low-order bit, respectively. In the same way, m21, m22 and m23; m31, m32 and m33; m41, m42 and m43; p11, p12 and p13; p21, p22 and p23; p31, p32 and p33; and q1, q2 and q3 are stored in the memory cells 2 to 8, respectively.

Each code word can be corrected even if a single error occurs. For instance, as shown in FIG. 5B, even if a burst error of three-bit length occurs in the third memory cell 3, since this error is a single error in each code word, the correction is enabled. In other words, even if the threshold voltage of one of the eight memory cells changes;

that is, even when a burst error such that the stored contents "100" change to "011" occurs, for instance, the correction is enabled. Further, if a burst error of one to three-bit length occurs in another memory cell, there are two errors in at least one code word. These two errors can be detected and one of them can be corrected.

The third embodiment of the method of data writing according to the present invention will be described hereinbelow.

The semiconductor device applied with the third embodiment is a sixteen-level memory device, in which the threshold voltage of each memory cell is set to any of sixteen levels (0V, 1V, 1.25V, 1.5V, 1.75V, 2V, 2.25V, 2.5V, 2.75V, 3V, 3.25V, 3.5V, 3.75V, 4V, 4.25V, 4.5V) corresponding to four-bit data (0000, 0001, 0010, 0011, 0100, 0101, 0110, 0111, 1000, 1001, 1010, 1011, 1100, 1101, 1110, 1111) to be stored.

In data rewriting, whenever 16-bit data is input, the input data is divided into 4×4 data bits (m11, m21, m31, m41), (m12, m22, m32, m42), (m13, m23, m33, m43) and (m14, m24, m34, m44). On the basis of the divided data bits, 3×4 redundant bits (p11, p21, p31), (p12, p22, p32), (p13, p23, p33) and (p14, p24, p34) are obtained.

On the basis of these data bits and redundant bits, four code words (m11, m21, m31, m41, p11, p21, p31), (m12, m22, m32, m42, p12, p22, p32), (m13, m23, m33, m43, p13, p23, p33) and (m14, m24, m34, m44, p14, p24, p34) are formed and put in the positions of 4×7 arrangement.

Figure 6:
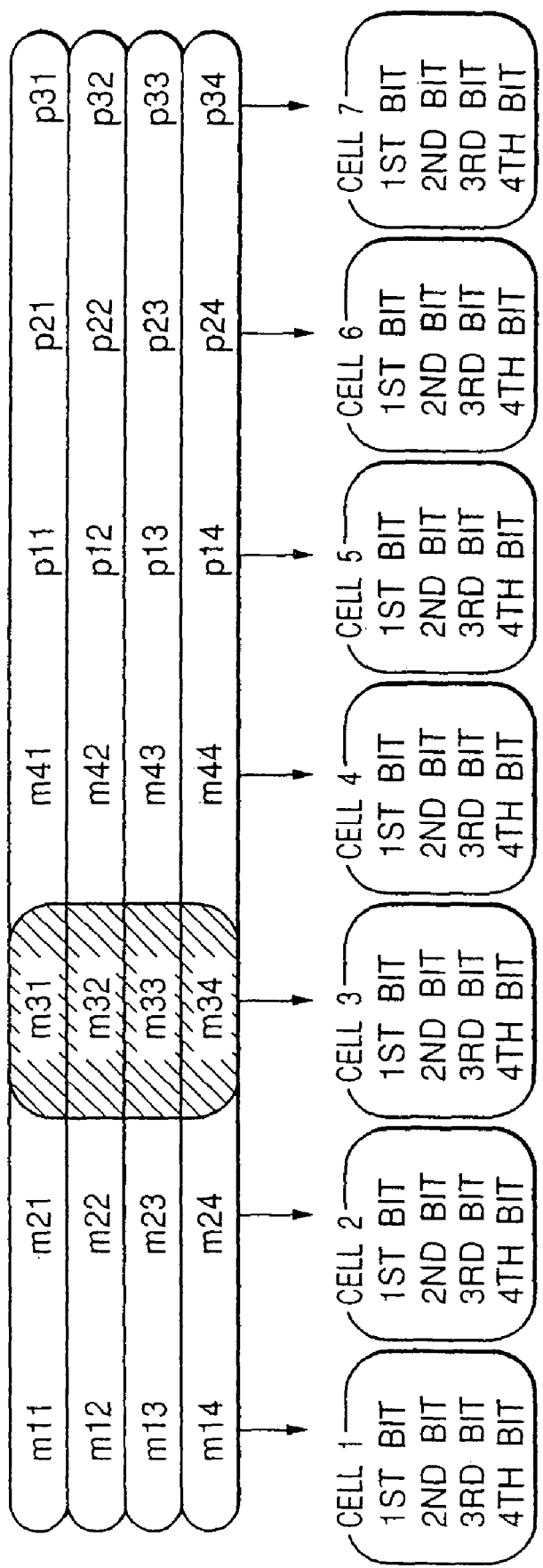
FIG. 6 is an illustration for assistance in explaining the third embodiment of the method of data writing according to the present invention.

Further, as shown in FIG. 6, (m11, m12, m13, m14), (m21, m22, m23, m24), (m31, m32, m33, m34), (m41, m42, m43, m44), (p11, p12, p13, p14), (p21, p22, p23, p24) and (p31, p32, p33, p34) are stored in the seven memory cells.

Accordingly, in FIG. 6, m11, m12, m13 and m14 are stored in the memory cell 1 as the first, the second, the third and the fourth bit, respectively. In the same way, m21, m22, m23 and m24; m31, m32, m33 and m34; m41, m42, m43 and m44; p11, p12, p13 and p14; p21, p22, p23 and p24; and p31, p32, p33 and p34 are stored in the memory cells 2 to 7, respectively.

Each code word can be corrected even if a single error occurs. For instance, as shown in FIG. 6, even if a burst error of four-bit length occurs in the third memory cell 3, since this error is a single error in a single code word, the correction is enabled. In other words, even if the threshold voltage of one of the seven memory cells changes; that is, even when a burst error such that the stored contents "1000" change to "0111" occurs, for instance, the correction is enabled.

Two modifications of the third embodiment of the method of data writing according to the present invention will be described hereinbelow.

The semiconductor device applied with the first modification is a sixteen-level memory device, in which the threshold voltage of each memory cell is set to any of sixteen levels (0V, 1V, 1.25V, 1.5V, 1.75V, 2V, 2.25V, 2.5V, 2.75V, 3V, 3.25V, 3.5V, 3.75V, 4V, 4.25V, 4.5V) corresponding to four-bit data (0000, 0001, 0010, 0011, 0100, 0101, 0110, 0111, 1000, 1001, 1010, 1011, 1100, 1101, 1110, 1111) to be stored. The first modification follows a specific linear coding standard in which two errors per bit of a code word can be corrected.

In data rewriting, whenever data composed of a specific number of bits, for example, p bits is input, the input data is divided into four (p/3) data bits. Redundant bits are obtained on the basis of the divided data bits to form two 14-bit code words (m11, m21, m31, m41, m51, m61, m71, m12, m22, m32, m42, m52, m62, m72) and (m13, m23, m33, m43, m53, m63, m73, m14, m24, m34, m44, m54, m64, m74). In each code word, a specific number of bits are data bits and the remaining bits are redundant bits for error correction.

Then, these 14-bit code words are divided into 7-bit code trains (m11, m21, m31, m41, m51, m61, m71) and (m12, m22, m32, m42, m52, m62, m72), and (m13, m23, m33, m43, m53, m63, m73) and (m14, m24, m34, m44, m54, m64, m74), respectively.

Then, the code trains are put in the positions of 4×7 arrangement. Further, as shown in FIG. 7A, (m11, m12, m13, m14), (m21, m22, m23, m24), (m31, m32, m33, m34), (m41, m42, m43, m44), (m51, m52, m53, m54), (m61, m62, m63, m64) and (m71, m72, m73, m74) are stored in the seven memory cells.

Accordingly, in FIG. 7A, m11, m12, m13 and m14 are stored in the memory cell 1 as the first, the second, the third and the fourth bit, respectively. In the same way, m21, m22, m23 and m24; m31, m32, m33 and m34; m41, m42, m43 and m44; m51, m52, m53 and m54; m61, m62, m63 and m64; and m71, m72, m73 and m74 are stored in the memory cells 2 to 7, respectively.

Each code train can be corrected even if a single error occurs. For instance, as shown in FIG. 7A, even if a burst error of four-bit length occurs in the third memory cell 3, since this error is a single error in each code train, and this error corresponds to two errors in the code word composed of two of the code trains, the correction is enabled. In other words, even if the threshold voltage of one of the seven memory cells changes; that is, even when a burst error such that the stored contents "1000" change to "0111" occurs, for instance, the correction is enabled.

Next, the second modification of the third embodiment of the method of data writing according to the present invention will be described hereinbelow.

The semiconductor device applied with the second modification is a sixteen-level memory device, in which the threshold voltage of each memory cell is set to any of sixteen levels (0V, 1V, 1.25V, 1.5V, 1.75V, 2V, 2.25V, 2.5V, 2.75V, 3V, 3.25V, 3.5V, 3.75V, 4V, 4.25V, 4.5V) corresponding to four-bit data (0000, 0001, 0010, 0011, 0100, 0101, 0110, 0111, 1000, 1001, 1010, 1011, 1100, 1101, 1110, 1111) to be stored. The second modification follows a specific coding standard in which a single error per bit of a code word can be corrected and two errors per bit of a code word can be detected.

In data rewriting, whenever 16-bit data is input, the input data is divided into 4×4 data bits (m11, m21, m31, m41), (m12, m22, m32, m42), (m13, m23, m33, m43) and (m14, m24, m34, m44). By means of Hamming codes, 3×4 redundant bits (p11, p21, p31), (p12, p22, p32), (p13, p23, p33) and (p14, p24, p34) are obtained on the basis of the divided data bits.

Then, all the seven bits are EX-ORed in each of the four code trains (m11, m21, m31, m41, p11, p21, p31), (m12, m22, m32, m42, p12, p22, p32), (m13, m23, m33, m43, p13, p23, p33) and (m14, m24, m34, m44, p14, p24, p34). The resultant redundant bits q1, q2, q3 and q4 are added to the four code trains, respectively, to form four code words (m11, m21, m31, m41, p11, p21, p31, q1), (m12, m22, m32, m42, p12, p22, p32, q2), (m13, m23, m33, m43, p13, p23, p33, q3) and (m14, m24, m34, m44, p14, p24, p34, q4).

Then, the four code words are put in the positions of 4×8 arrangement. Further, as shown in FIG. 7B, (m11, m12, m13, m14), (m21, m22, m23, m24), (m31, m32, m33, m34), (m41, m42, m43, m44), (p11, p12, p13, p14), (p21, p22, p23, p24), (p31, p32, p33, p34) and (q1, q2, q3, q4) are stored in the eight memory cells.

Accordingly, in FIG. 7B, m11, m12, m13 and m14 are stored in the memory cell 1 as the first, the second, the third and the fourth bit, respectively. In the same way, m21, m22, m23 and m24; m31, m32, m33 and m34; m41, m42, m43 and m44; p11, p12, p13 and p14; p21, p22, p23 and p24; p31, p32, p33 and p34; and q1, q2, q3 and q4 are stored in the memory cells 2 to 8, respectively.

Each code word can be corrected even if a single error occurs. For instance, as shown in FIG. 7B, even if a burst error of four-bit length occurs in the third memory cell 3, since this error is a single error in each code word, the correction is enabled. In other words, even if the threshold voltage of one of the eight memory cells changes; that is, even when a burst error such that the stored contents "1000" change to "0111" occurs, for instance, the correction is enabled. Further, if a burst error of one-to four-bit length occurs in another memory cell, there are two errors in at least one code word. These two errors can be detected and one of them can be corrected.

Another modification besides the modifications of the second and the third embodiments of the method of data writing according to the present invention will be described hereinbelow.

For example, 56 bits of "0" are added to 64 pieces of original data to obtain 120-bit data. A 127-bit length hamming code is obtained on the basis of the 120-bit data. All the 127 bits are EX-ORed to obtain a 128-bit code. The additional 56-bit "0" are removed from the 128-bit code to obtain a 72-bit code word.

This coding method is capable of correcting one error and detecting two errors per bit of a code word and often used as the SEC/DED code (Single-Error-Correction/Double-Error-Detecting Code) for main memories.

A practical example that the error correction is enabled even if one error occurs in a single code word will be described hereinbelow. A table below lists Hamming codes in which three redundant bits are added to four data bits.

TABLE 1

| DIGITS: | 1234567 |
|---|---|
| BIT WEIGHT: | CC8C421 |
| | 0 = 0000000 |
| | 1 = 1101001 |
| | 2 = 0101010 |
| | 3 = 1000011 |
| | 4 = 1001100 |
| | 5 = 0100101 |
| | 6 = 1100110 |
| | 7 = 0001111 |
| | 8 = 1110000 |
| | 9 = 0011001 |
| | 10 = 1011010 |
| | 11 = 0110011 |
| | 12 = 0111100 |
| | 13 = 1010101 |
| | 14 = 0010110 |
| | 15 = 1111111 |
| Digits: | 1234567 |
| Read code: | 0101100 |
| (4, 5, 6, 7) digit parity: | - - - - → 0 |
| (2, 3, 6, 7) digit parity: | - - - - → 1 |
| (1, 3, 5, 7) digit parity: | - - - - → 1 |
| Error digit: | 011 = 3 |

In these Hamming codes, 1, 2 and 4 digits are redundant bits, and these bits are decided in such a way that an even parity can be obtained in each digit set of (1, 3, 5, 7), (2, 3, 6, 7) and (4, 5, 6, 7). For instance, when a code "0111100" corresponding to a decimal number of [12] is written, in case an error occurs so that a code "0101100" is read, it is possible to obtain an error digit by a binary number (011 in this case) as shown in TABLE 1. Therefore, even if an error occurs, it is possible to correct the error securely.

Further, when the number of data bits is increased, since this code can be extended to that number, the number of redundant bits m necessary for the n number of data bits can be expressed as $$2^n = n + m + 1 \qquad (1)$$

In the above description, the case where the present invention is applied to a non-volatile memory device having floating gate type memory cells has been described. However, without being limited only to the floating gate type memory cell, the present invention can be of course applied to MNOS (Metal-Nitride-Oxide-Silicon) type semiconductor memory devices.

Further, the present invention can be applied to EPROMs, PROMs, mask ROMs, etc. in addition to the EEPROMs. In the mask ROMs, a storage status can be obtained by changing the threshold level thereof on the basis of the control of impurity quantity put in the channel region of a field effect transistor by ion implantation.

Further, the four- and eight-level memory cells have been described by way of example hereinabove. However, the data writing according to the present invention is not of course limited to only these levels.

Further, as a method of obtaining error correction codes, although interleaving has been explained, as far as an error of a burst length corresponding to the data quantity stored in the memory cell can be corrected by means of the error correction code, another method can be of course adopted, such as cyclic codes or compact cyclic codes.

Next, embodiments of the method of data reading according to the present invention will be described hereinbelow with reference to the attached drawings.

Described in the first embodiment are the multilevel EEPROM shown in FIG. 1 and a method of data reading from the EEPROM.

In the read operation, first an external logical address signal is input to the converter 9 via input I/F 7. The converter 9 generates a physical address signal corresponding to an actual memory cell on the basis of the input logical address signal. In response to the physical address signal, the signal controller 6 decides a word line (control gate of FIG. 2) 19 and a bit line 15 (FIG. 2) both to be selected, and instructs the decided results to the decoder 2 and the multiplexer 4. According to the instructions, the decoder 2 selects the word line 19, and the multiplexer 4 selects the bit line 15.

The signal controller 6 decides the magnitude of the voltage to be applied to the control gate 19 of the selected memory cell, and instructs the decided voltage to the voltage controller 3. The voltage controller 3 applies the decided voltage to the selected word line 19 via decoder 2. On the other hand, the multiplexer 4 applies a predetermined voltage to the selected bit line 15. Therefore, it is possible to determine whether a current flows through the selected bit line 15 according to the threshold voltage of the selected memory cell.

A status of the current with respect to the selected bit line 15 is transmitted from the multiplexer 4 to the sense amplifier 5. The sense amplifier 5 detects the presence or absence of the current flowing through the selected bit line 15, and transmits the detected result to the signal controller 6. On the basis of the detected result of the sense amplifier 5, the signal controller 6 decides a voltage to be next applied to the control gate 19 of the selected memory cell, and instructs the decided result to the voltage controller 3. Further, the signal controller 6 outputs the stored data of the selected memory cell obtained by repeating the above-mentioned procedure, via output I/F 8.

Figure 8:
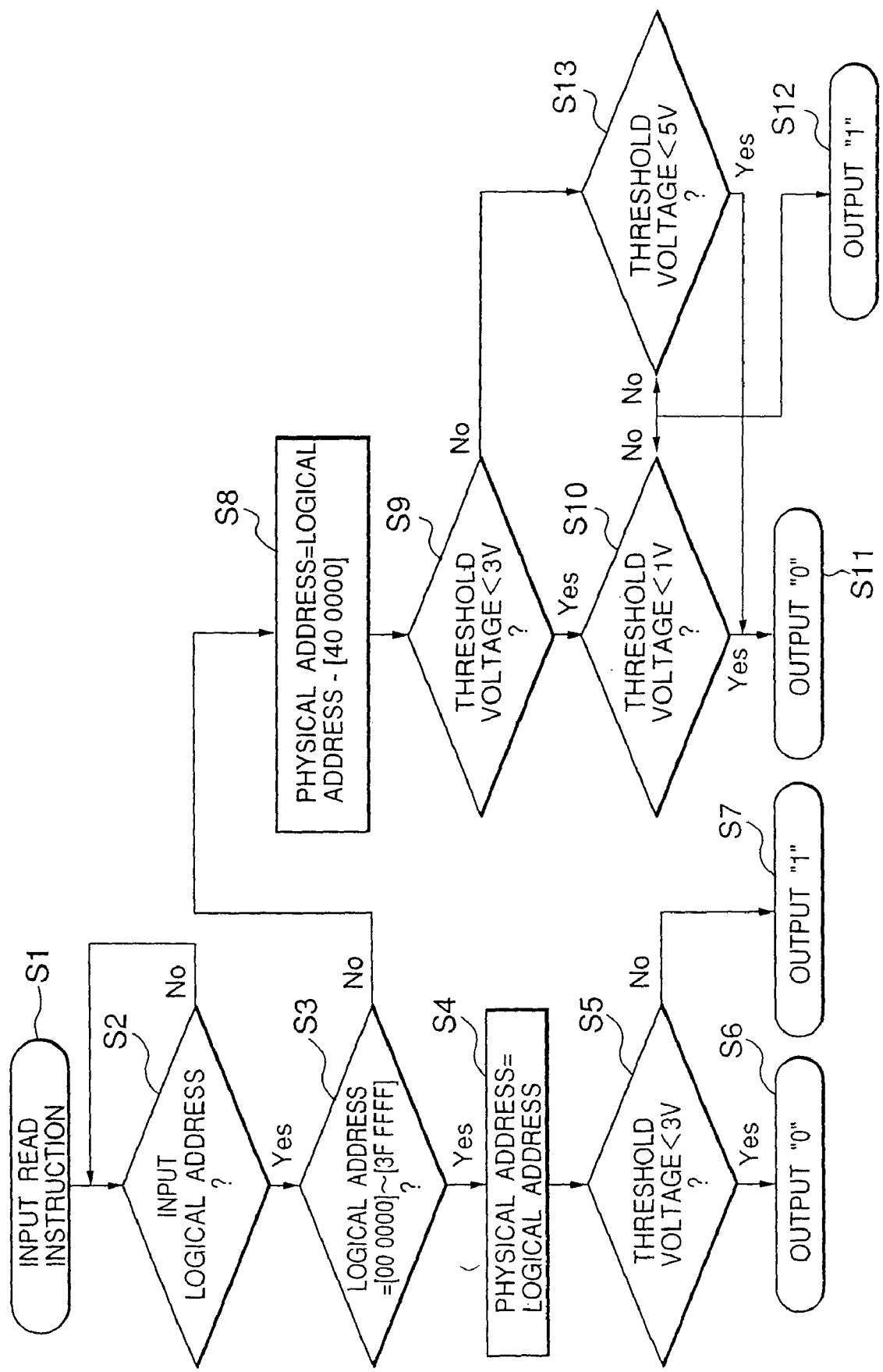
FIG. 8 is a flowchart showing the first embodiment of the method of data reading according to the present invention.

FIG. 8 shows the flowchart showing a procedure of the first embodiment of the reading method according to the present invention. A four-level EEPROM having a storage capacity of 8 Mbits will be explained by way of example. The four-level EEPROM has a logical address space of [00 0000] to [7F FFFF] and a physical address space of [00 0000] to [3F FFFF] in hexadecimal notation. Further, each memory cell stores 2-bit (=four levels) data (00, 01, 10, 11), so that the threshold voltages of (0V, 2V, 4V, 6V) are set to memory cells according to these data.

when the physical address of a memory cell is Ap, the data of the logical address Ap is stored in the high-order bit of the two bits of the memory cell, and the logical address (Ap+[40 0000]) is stored in the low-order bit thereof.

In other words, in the data rewriting operation, when the logical address A1 of [00 0000] to [3F FFFF] and the data (0 or 1) to be stored are designated, the high-order bit of the memory cell existing at the physical address A1 is rewritten to the designated data.

On the other hand, in the data rewriting operation, when the logical address A1 of [40 0000] to [7F FFFF] and the data (0 or 1) to be stored are designated, the low-order bit of the memory cell existing at the physical address (A1=[40 0000]) is rewritten to the designated data.

In FIG. 8, when an external read instruction is input in step S1 and further a logical address signal is input to the input I/F 7 in step S2, the signal controller 6 determines whether the input logical address signal indicates an address in the range of [00 0000] to [3F FFFF] or not in step S3.

In step S3, when the logical address signal indicates an address in the range of [00 0000] to [3F FFFF], since the logical address matches the physical address, it is decided that the data to be read is the high-order bit of the two bits in step S4. In this case, a reference voltage of 3V is applied to the control gate 19 of the selected memory cell, and further it is determined whether a current flows between the drain 12 and the source 13 through the selected bit line 15 and the sense amplifier 5 in step S5.

In step S5, when the current flows between the drain 12 and the source 13 of the selected memory cell; that is, when the selected memory cell is conductive, it is decided that the high-order bit of the 2-bit data stored in this memory cell is "0" since the threshold voltage of this selected memory cell is 0V or 2V. The decided data is output immediately via output I/F 8 in step S6.

On the other hand, in step S5, when the current does not flow between the drain 12 and the source 13 of the selected memory cell, it is decided that the high-order bit of the 2-bit data stored in this memory cell is "1".

Because the threshold voltage of this selected memory cell is 4V or 6V. The decided data is output immediately via output I/F 8 in step S7.

Further, in step S3, when the logical address signal input to the input I/F 7 indicates an address in the range of [40 0000] to [7F FFFF], the logical address does not match the physical address; that is, the physical address is (logical address−[40 0000]). It is decided that the data to be read is the low-order bit of the two bits in step S8. In this case, a reference voltage of 3V is applied to the control gate 19 of the selected memory cell, and further it is determined whether a current flows between the drain 12 and the source 13 through the selected bit line 15 and the sense amplifier 5 in step S9.

In step S9, when the current flows between the drain 12 and the source 13 of the selected memory cell, the signal control circuit 6 instructs the voltage control circuit 3 to apply a reference voltage of 1V to the control gate 19 of the selected memory cell in step S10. Because, the threshold voltage of this selected memory cell is 0V or 2V.

Further, in step S10, when a current flows between the drain 12 and the source 13 of the selected memory cell, it is decided that the low-order bit of the 2-bit data of this memory cell is "0". Because the threshold voltage of this memory cell is 0V. The decided data is output immediately via output I/F 8 in step S11.

On the other hand, in step S10, when the current does not flow between the drain 12 and the source 13 of the selected memory cell, it is decided that the low-order bit of the 2-bit data of this memory cell is "1". Because the threshold voltage of this selected memory cell is 2V. The decided data is output immediately via output I/F 8 in step S12.

Further, in step S9, when the current does not flow between the drain 12 and the source 13 of the selected memory cell, the signal controller 6 instructs the voltage controller 3 to apply a reference voltage of 5V to the control gate 19 of the selected memory cell in step S13. Because the threshold voltage of this selected memory cell is 4V or 6V.

Further, in step S13, when a current flows between the drain 12 and the source 13 of the selected memory cell, it is decided that the low-order bit of the 2-bit data of this memory cell is "0". Because the threshold voltage of this memory cell is 4V. The decided data is output immediately via output I/F 8 in step S12.

On the other hand, in step S13, when the current does not flow between the drain 12 and the source 13 of the selected memory cell, it is decided that the low-order bit of the 2-bit data of this memory cell is "1". Because the threshold voltage of this memory cell is 6V. The decided data is output immediately via output I/F 8 in step S13.

With respect to the reading method described above, a method of determining whether a current flows between the drain 12 and the source 13 of a selected memory cell by applying a reference voltage of 1V, 3V or 5V to the control gate 19 of the selected memory cell will be explained with reference to FIGS. 1 and 9.

For instance, in step S4 in FIG. 8, when the signal controller 6 receives a physical address from the converter 9 and decides that the data to be read is the high-order bit of the 2-bit data, the signal controller 6 further decides that the voltage to be applied to the control gate 19 of a selected memory cell is 3V and instructs the decided voltage to the voltage controller 3.

Figure 9:
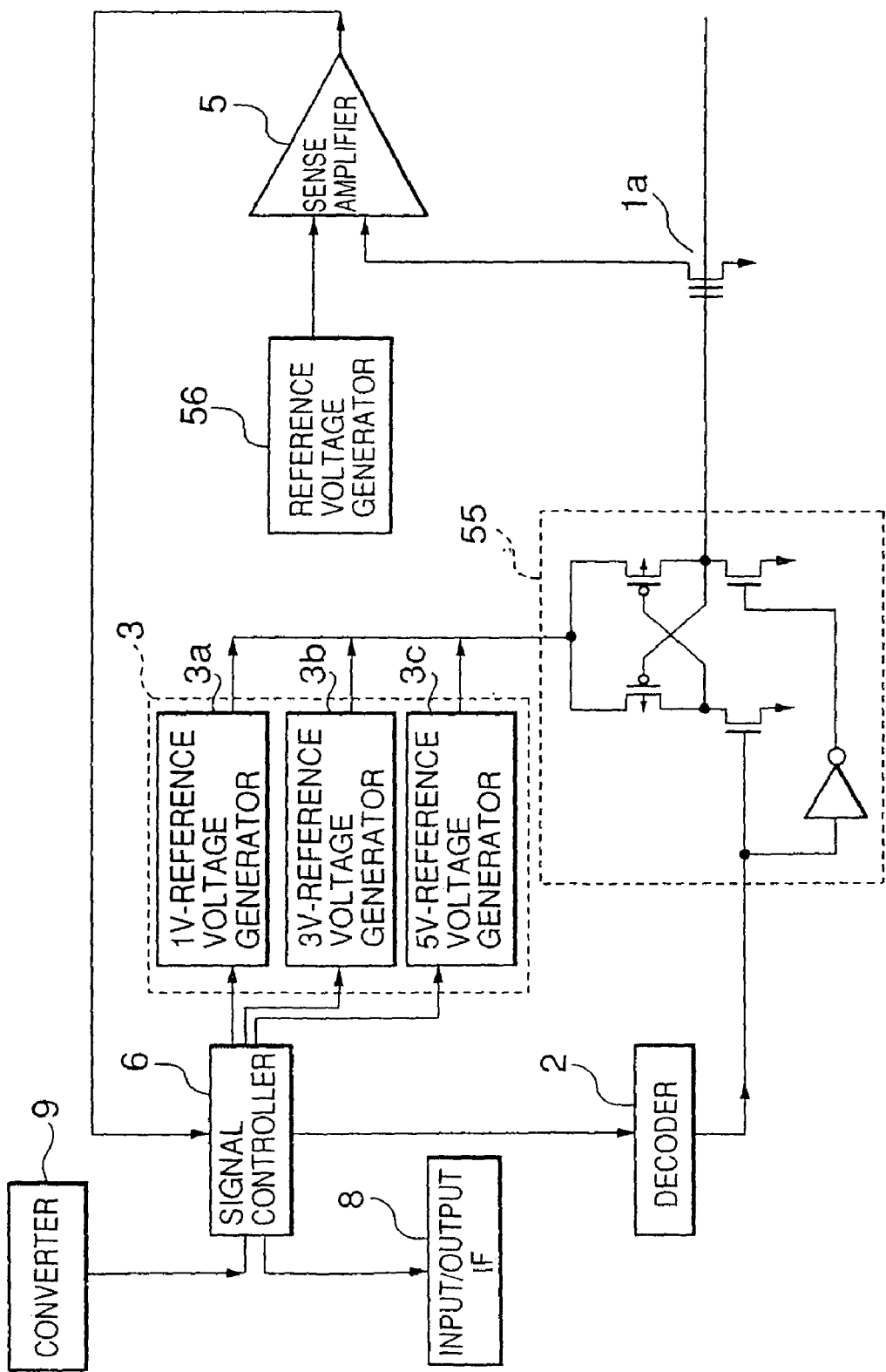
FIG. 9 is a block diagram for explaining a method of judging a threshold voltage in the flowchart shown in FIG. 8.

In FIG. 9, the voltage controller 3 includes a 1V-reference voltage generator 3a, a 3V-reference voltage generator 3b and a 5V-reference voltage generator 3c.

In this example, the reference voltage generator 3b generates and applies 3V as a reference voltage to a switching circuit 55. The signal controller 6 decides a word line to be selected in response to an input physical address and instructs the decided result to the decoder 2. According to the instruction, the decoder 2 outputs a decoding signal to the switching circuit 55.

On receiving the 3V-reference voltage and the decoding signal, the switching circuit 55 applies the 3V-reference voltage to the selected word line.

The sense amplifier 5 determines whether a current flows between the drain 12 and the source 13 of a selected memory cell 1a of the cell array 1. More in detail, the sense amplifier 5 compares an output voltage of the memory cell 1a and a predetermined reference voltage from a reference voltage generator 56. The comparison result is instructed to the signal controller 6.

According to the instruction, the signal controller 6 decides a voltage of 1V or 5V that is applied next to the memory cell 1a. The signal controller 6 then outputs data stored in the memory cell 1a via output I/F 8.

As described above, in this first embodiment, the logical addresses [00 0000] to [7F FFFF] are divided hieratically into an address space $A_1$ (logical addresses: [00 0000] to [3F FFFF] of relatively high access speed and an address space $A_2$ (logical addresses: [40 0000] to [7F FFFF] of relatively low access speed. And, a partial space (logical addresses: [00 0000] to [3F FFFF]) one-to-one corresponding to the address space formed by the physical addresses ([00 0000] to [3F FFFF]) within the logical addresses [00 0000] to [7F FFFF] is determined as the address space $A_1$ of relatively high access speed. Further, data in the address space $A_1$ is stored in the specific component (here, the high-order bit) of the storage status of each memory cell.

When the input logical address is included in the above-mentioned partial space (the logical addresses [00 0000] to [3F FFFF]), this logical address designates the high-order bit data. It is thus possible to immediately detects this high-order bit data by a single decision process by use of the reference voltage of 3V. The detected high-order bit data is then output. In this case, it is possible to increase the access speed twice, as compared with the case where the respective threshold voltages are checked by use of all the reference voltages.

Therefore, the data having the highest access frequency can be stored in the high-order bits and the data having a relatively low access frequency can be stored in the low-order bits. A programmer can operate the EEPROM as if a single high speed memory device were provided according to the invention. It is thus possible to read data from the multilevel EEPROM in an extremely high efficiency.

Further, as the data and programs suitably stored in the multilevel EEPROM, there are BIOS (Basic Input/output System) of an arithmetic unit. (as an example of the high access frequency) and a document file (as an example of a relatively low access frequency). In this case, the former is stored in the high-order bits of the high access speed, and the later is stored in the low-order bits of the low access speed.

The second embodiment of the method of data reading according to the present invention will be described hereinbelow.

In the second embodiment, a multilevel EEPROM is used in the same way as with the case of the first embodiment of the method of data reading according to the present invention. The essential configuration of the multilevel EEPROM is the same as with the case of the first embodiment, except that an eight-level EEPROM having a storage capacity of 12 Mbits is used in the second embodiment. The configuration of the eight-level EEPROM is basically the same as with the case of the first embodiment, so that any detailed description thereof is omitted herein.

Figure 10:
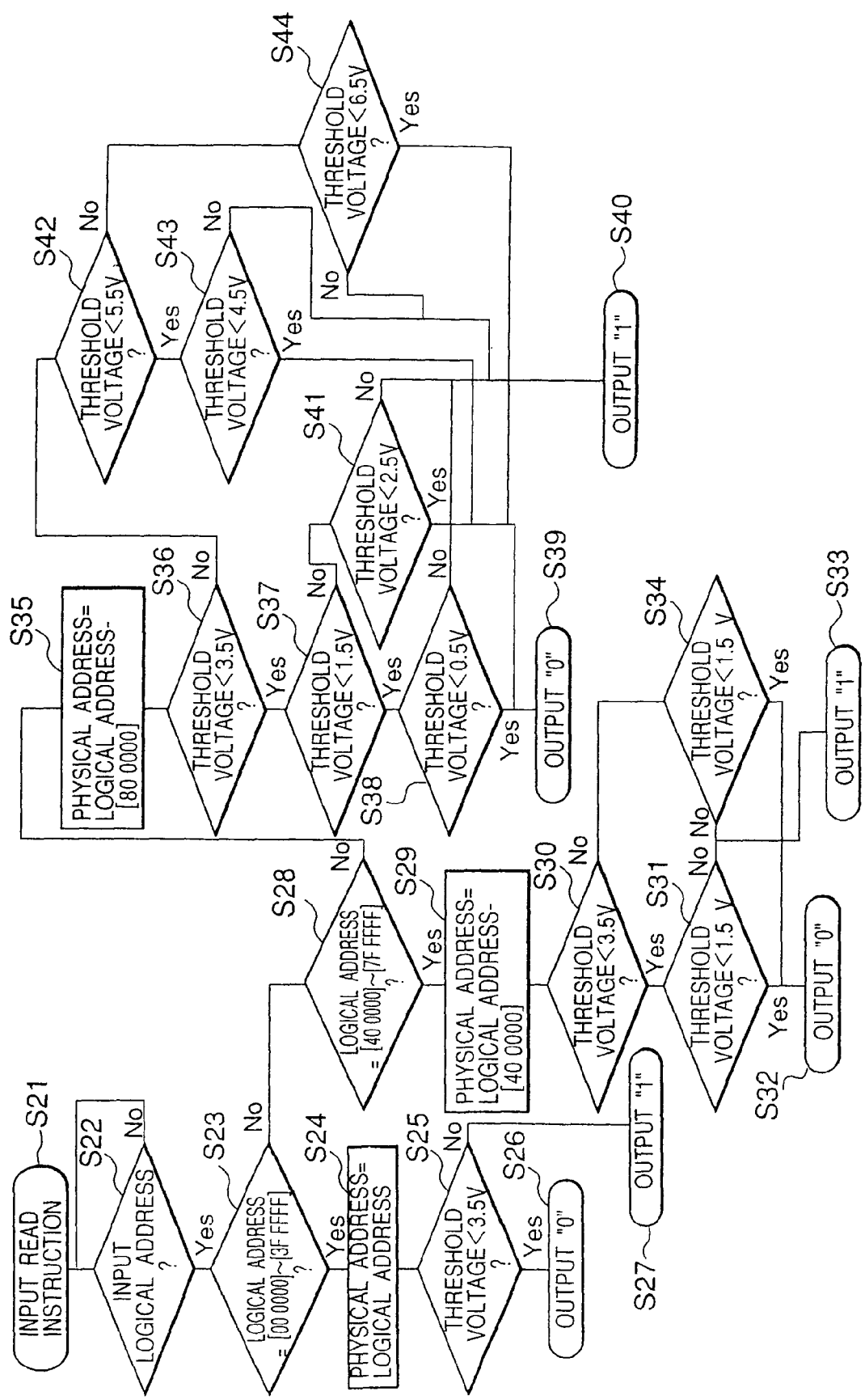
FIG. 10 is a flowchart showing the second embodiment of the method of data reading according to the present invention.

FIG. 10 shows the flowchart showing a procedure of the second embodiment of the reading method according to the present invention. In the second embodiment, an eight-level EEPROM having a storage capacity of 12 Mbits will be explained by way of example. The eight-level EEPROM has a logical address space of [00 0000] to [BF FFFF] and a physical address space of [00 0000] to [3F FFFF] in hexadecimal notation. Further, each memory cell stores 3 bit (=eight levels) data (000, 001, 010, 011, 100, 101, 110, 111), so that the threshold voltages of (0V, 1V, 2V, 3V, 4V, 5V, 6V, 7V) are set to memory cells according to these data.

Further, when the physical address of a memory cell is Ap, the data of the logical address Ap is stored in the highest-order bit of the respective components of the thee bits; the logical address (Ap+[40 000]) is stored in the medium bit; and the logical address (Ap+[80 0000] is stored in the lowest-order bit thereof.

In other words, in the data rewriting operation, when the logical address A1 in the range of [00 0000] to [3F FFFF] and the data (0 or 1) to be stored are designated, the highest-order bit of the memory cell existing at the physical address A1 is rewritten to the designated data.

On the other hand, in the data rewriting operation, when the logical address A1 in the range of [40 0000] to [7F FFFF] and the data (0 or 1) to be stored are designated, the medium-order bit of the memory cell existing at the physical address (A1−[40 0000]) is rewritten to the designated data.

Further, in the data rewriting operation, when the logical address A1 in the range of [80 0000] to [BF FFFF] and the data (0 or 1) to be stored are designated, the lowest-order bit of the memory cell existing at the physical address (A1−[80 0000]) is rewritten to the designated data.

In FIG. 10, when an external read instruction is input in step S21 and further a logical address signal is input to the input I/F 7 in step S22, the signal controller 6 determines whether the input logical address signal indicates an address in the range of [00 0000] to [3F FFFF] or not in step S23.

In step S23, when the logical address signal indicates an address in the range of [00 0000] to [3F FFFF], since the logical address matches the physical address, it is decided that the data to be read is the highest-order bit of the three bits in step S24. In this case, a reference voltage of 3.5V is applied to the control gate 19 of the selected memory cell. And, further it is determined whether a current flows between the drain 12 and the source 13 through the selected bit line 15 and the sense amplifier 5 in step S25.

In step S25, when the current flows between the drain 12 and the source 13 of the selected memory cell; that is, when the selected memory cell is conductive, the threshold voltage of this selected memory cell is any one of 0V, 1V, 2V and 3V and further the three bit data designated by these threshold voltages are "000", "001", "010" and "011". It is thus decided that the highest-order bit of the three bits of the storage status of this memory cell is "0". The decided data is output immediately via output I/F 8 in step S26.

On the other hand, in step S25, when the current does not flow between the drain 12 and the source 13 of the selected memory cell, the threshold voltage of this selected memory cell is any one of 4V, 5V, 6V and 7V and further the three bit data designated by these threshold voltages are "100", "101", "110" and "111". It is thus decided that the highest-order bit of the three bits of the storage status of this memory cell is "1". The decided data is output immediately via output I/F 8 in step S27.

Further, in step S23, when the logical address signal input to the input I/F 7 does not indicate an address in the range of [00 0000] to [3F FFFF], it is determined whether the further input logical address signal indicates an address in the range of [40 0000] to [7F FFFF] or not in step S28.

Here, in step S28, when the logical address signal input to the input I/F 7 indicates an address in the range of [40 0000] to [7F FFFF], the logical address does not match the physical address; that is, the physical address is (logical address–[40 0000].) It is thus decided that the data to be read is the medium-order bit of the three bits in step S29. In this case, a reference voltage of 3.5V is applied to the control gate 19 of the selected memory cell. And, further it is determined whether a current flows between the drain 12 and the source 13 through the selected bit line 15 and the sense amplifier 5 in step S30.

In step S30, when a current flows between the drain 12 and the source 13 of the selected memory cell, the threshold voltage of the memory cell is any one of 0V, 1V, 2V and 3V. Here, the three bit data designated by the threshold voltages of 0V and 1V are "000" and "001"; that is, the medium-order bit is "0" in both. Further, the three bit data designated by the threshold voltages of 2V and 3V are "010" and "011"; that is, the medium-order bit is "1" in both. Therefore, in order to decide the medium-order bit, the signal controller 6 instructs the voltage controller 3 to apply a reference voltage of 1.5V to the control gate 19 of the selected memory cell in step S31.

Further, in step S31, when a current flows between the drain 12 and the source 13 of the selected memory cell, the threshold voltage of the memory cell is 0V or 1V. It is thus decided that the medium-order bit of the three bits of the storage status of this memory cell is "0". The decided data is output immediately through the output I/F 8 in step S32.

On the other hand, in step S31, when the current does not flow between the drain 12 and the source 13 of the selected memory cell, the threshold voltage of the memory cell is 2V or 3V. It is thus decided that the medium-order bit of the three bits of the storage status of this memory cell is "1". The decided data is output immediately via output I/F 8 in step S33.

Further, in step S30, when the current does not flow between the drain 12 and the source 13 of the selected memory cell, the threshold voltage of the memory cell is any one of 4V, 5V, 6V and 7V. Here, the three-bit data designated by the threshold voltages of 4V and 5V are "100" and "101"; that is, the medium-order bit is "0" in both. Further, the three-bit data designated by the threshold voltages of 6V and 7V are "010" and "011"; that is, the medium-order bit is "1" in both. Therefore, in order to decide the medium-order bit, the signal controller 6 instructs the voltage controller 3 to apply a reference voltage of 5.5V to the control gate 19 of the selected memory cell in step S34.

Further, in step S34, when a current flows between the drain 12 and the source 13 of the selected memory cell, the threshold voltage of the memory cell is 4V or 5V. It is thus decided that the medium-order bit of the three bits of the storage status of this memory cell is "0". The decided data is output immediately via output I/F 8 in step S32.

On the other hand, in step S34, when the current does not flow between the drain 12 and the source 13 of the selected memory cell, the threshold voltage of the memory cell is 6V or 7V. It is thus decided that the medium-order bit of the three bits of the storage status of this memory cell is "1". The decided data is output immediately via output I/F 8 in step S33.

Further, in step S28, when the logical address signal input to the input I/F 7 does not indicate an address in the range of [40 0000] to [7F FFFF], the logical address signal indicates an address in the range of [80 0000] to [BF FFFF]; that is, the physical address=(logical address–[80 0000].) It is thus decided that the data to be read is the lowest-order bit of the three bits in step S35. In this case, a reference voltage of 3.5V is applied to the control gate 19 of the selected memory cell. And, it is detected whether a current flows between the drain 12 and the source 13 through the selected bit line 15 and the sense amplifier 5 in step S36.

In step S36, when a current flows between the drain 12 and the source 13, the threshold voltage of the memory cell is any one of 0V, 1V, 2V and 3V. The three bit data designated by the threshold voltages of these threshold-voltages are thus "000", "001", "010" and "011". Therefore, it is impossible to specify the lowest-order bit at this stage. In order to specify the lowest-order bit, the signal controller 6 instructs the voltage controller 3 to apply a reference voltage of 1.5V to the control gate 19 of the selected memory cell in step S37.

In step S37, when a current flows between the drain 12 and the source 13 of the selected memory cell, the threshold voltage of the memory cell is 0V or 1V. It is thus decided that the three-bit data specified by these threshold voltages are "000" or "001". Therefore, in order to specify the lowest-order bit, the signal controller 6 instructs the voltage controller 3 to apply a reference voltage of 0.5V to the control gate 19 of the selected memory cell in step S38.

Further, in step S38, when a current flows between the drain 12 and the source 13 of the selected memory cell, the threshold voltage of the memory cell is 0V. It is thus decided that the lowest-order bit of the three bits of the storage status of this memory cell is "0". The decided data is output immediately via output I/F 8 in step S39.

On the other hand, in step S38, when the current does not flow between the drain 12 and the source 13 of the selected memory cell, the threshold voltage of the memory cell is 1V.

It is thus decided that the lowest-order bit of the three bits of the storage status of this memory cell is "1". The decided data is output immediately via output I/F 8 in step S40.

Further, in step S37, when the current does not flow between the drain 12 and the source 13 of the selected memory cell, the threshold voltage of the memory cell is 2V or 3V. The three-bit data designated by the threshold voltages of these threshold voltages are thus "010" or "011". Therefore, in order to specify the lowest-order bit, the signal controller 6 instructs the voltage controller 3 to apply a reference voltage of 2.5V to the control gate 19 of the selected memory cell in step S41.

In step S41, when a current flows between the drain 12 and the source 13 of the selected memory cell, the threshold voltage of the memory cell is 2V. It is thus decided that the lowest-order bit of the three bits of the storage status of this memory cell is "0". The decided data is output immediately via output I/F 8 in step S39.

On the other hand, in step S41, when the current does not flow between the drain 12 and the source 13 of the selected memory cell, the threshold voltage of the memory cell is 3V. It is thus decided that the lowest-order bit of the components of the storage status of this memory cell is "1". The decided data is output immediately via output I/F 8 in step S40.

Further, in step S36, when the current does not flow between the drain 12 and the source 13, the threshold voltage of the memory cell is any one of 4V, 5V, 6V and 7V. The three-bit data designated by the threshold voltages of these threshold voltages are thus "100", "101", "110" and "111". Therefore, it is impossible to specify the lowest-order bit at this stage. Therefore, in order to specify the lowest-order bit, the signal controller 6 instructs the voltage controller 3 to apply a reference voltage of 5.5V to the control gate 19 of the selected memory cell in step S42.

In step S42, when a current flows between the drain 12 and the source 13 of the selected memory cell, the threshold voltage of the memory cell is 4V or 5V. The three-bit data designated by these threshold voltages are thus "100" or "101". Therefore, in order to specify the lowest-order bit, the signal controller 6 instructs the voltage controller 3 to apply a reference voltage of 4.5V to the control gate 19 of the selected memory cell in step S43.

Further, in step S43, when a current flows between the drain 12 and the source 13 of the selected memory cell, the threshold voltage of the memory cell is 4V. It is thus decided that the lowest-order bit of the three bits of the storage status of this memory cell is "0". The decided data is output immediately via output I/F 8 in step S39.

Further, in step S43, when the current does not flow between the drain 12 and the source 13 of the selected memory cell, the threshold voltage of the memory cell is 5V. It is thus decided that the lowest-order bit of the three bits of the storage status of this memory cell is "1". The decided data is output immediately via output I/F 8 in step S40.

Further, in step S42, when the current does not flow between the drain 12 and the source 13 of the selected memory cell, the threshold voltage of the memory cell is 6V or 7V. The three-bit data designated by the threshold voltages of these threshold voltages are thus "110" or "111". Therefore, in order to specify the lowest-order bit, the signal controller 6 instructs the voltage controller 3 to apply a reference voltage of 6.5V to the control gate 19 of the selected memory cell in step S44.

In step S44, when a current flows between the drain 12 and the source 13 of the selected memory cell, the threshold voltage of the memory cell is 6V. It is thus decided that the lowest-order bit of the three bits of the storage status of this memory cell is "0". The decided data is output immediately through the output I/F 8 in step S39.

On the other hand, in step S44, when the current does not flow between the drain 12 and the source 13 of the selected memory cell, the threshold voltage of the memory cell is 7V. It is thus decided that the lowest-order bit of the three bits of the storage status of this memory cell is "1". The decided data is output immediately via output I/F 8 in step S40.

As described above, in the second embodiment, the logical addresses in the range of [00 0000] to [BF FFFF] are divided hieratically into an address space of relatively high access speed and an address space of relatively low access speed. Here, the address space of relatively high access speed is determined as an address space $A_1$ (logical addresses: [00 0000] to [3F FFFF]. Further, the address space of relatively low access speed is further divided hieratically into two address spaces. That is, the address space of the medium access speed next to the address space $A_1$ is determined as an address space $A_2$ (logical addresses: [40 0000] to [BF FFFF], and the address space of the lowest access speed next to the address space $A_2$ is determined as an address space $A_3$ (logical addresses: [40 0000] to [BF FFFF], both hierarchically.

Further, a partial space (logical addresses: [00 0000] to [3F FFFF]) one-to-one corresponding to the address space formed by the physical addresses ([00 0000] to [3F FFFF]) within the logical addresses in the range of [00 0000] to [7F FFFF] is determined as the address, space $A_1$ of relatively high access speed. Further, data in the address space $A_1$ is stored in the specific bit of the storage status of the memory cell, that is, the highest-order bit. Further, data in the address space $A_2$ of the access speed next to that of the address space $A_1$ is stored in the medium-order bit. Further, data in the address space $A_3$ of the access speed next to that of the address space $A_2$ is stored in the lowest-order bit.

When the input logical address is included in the above-mentioned partial space (i.e., logical addresses [00 0000] to [3F FFFF]), this logical address designates data of the highest-order bit. It is thus possible to immediately decide this highest-order bit data by a single decision by use of the reference voltage of 3.5V. The decided highest-order bit data is then output. Further, when the input logical address is not included in the above-mentioned partial space (i.e., logical addresses [00 0000] to [3F FFFF]) but included in the address space (i.e., logical addresses [40 0000] to [7F FFFF]) adjacent to the partial space, this logical address designates data of the medium-order bit. It is thus possible to immediately decide this medium-order bit data by two decisions by use of the reference voltages of 3.5V and 1.5 or 5.5V. The decided medium order-bit data is then output.

Therefore, when the data of the highest-order bit is read, it is possible to increase the access speed three times hither than that of when the respective threshold voltages are checked by use of all the reference voltages. Further, when the data of the medium-order bit is read, it is possible to increase the access speed about 1.5 times higher than that of when the respective threshold voltages are checked by use of all the decision voltages. Therefore, the data having the highest access frequency can be stored in the highest-order bits, the data having the medium access frequency in the medium-order bits, and the data having a relatively low access frequency in the lowest-order bits. A programmer thus can operate the EEPROM as if a single- or double-stage high speed memory devices were provided. It is thus possible to read data from the multilevel EEPROM in an extremely high efficiency.

The multilevel semiconductor memory device has been explained by taking the case of the EEPROM of floating gate type memory cells. However, without being limited only thereto, it is possible to apply the multilevel semiconductor memory device according to the present invention to MNOS type memory cells.

Further, without being limited to only EEPROM, the data reading method according to the present invention can be applied to the case when the multilevel data stored in EPROM or PROM are read. Further, the data reading method according to the present invention can be applied to a mask ROM whose storage status can be obtained by changing the threshold values thereof on the basis of control of the concentration of impurities put in the channel regions of field effect transistors by ion implantation.

The data reading according to the present invention can further be applied to DRAMs (Dynamic Random Access memory). It can be understood that refreshing must be done after data reading in case of DRAMs.

Further, in the first and second embodiments, two or three bits are stored in a single memory cell. However, the present invention can be applied to the case where four or more levels (i.e., two or more bits) are stored in a single memory cell. In particular, the effect of the present invention can be increased with increasing capacity of the memory cell.

As described above, the data reading methods in the first and second embodiments are, after an address of a memory cell is decided, to determine whether a current flows between a drain and a source of the memory cell by applying a judging voltage to a control gate of the memory cell having a specific threshold voltage to judge data stored in the memory cell.

Not only this, data stored in a memory cell can be judged by comparing an output voltage of the memory cell with a predetermined judging voltage. This method will be explained with reference to FIG. 11.

Figure 11:
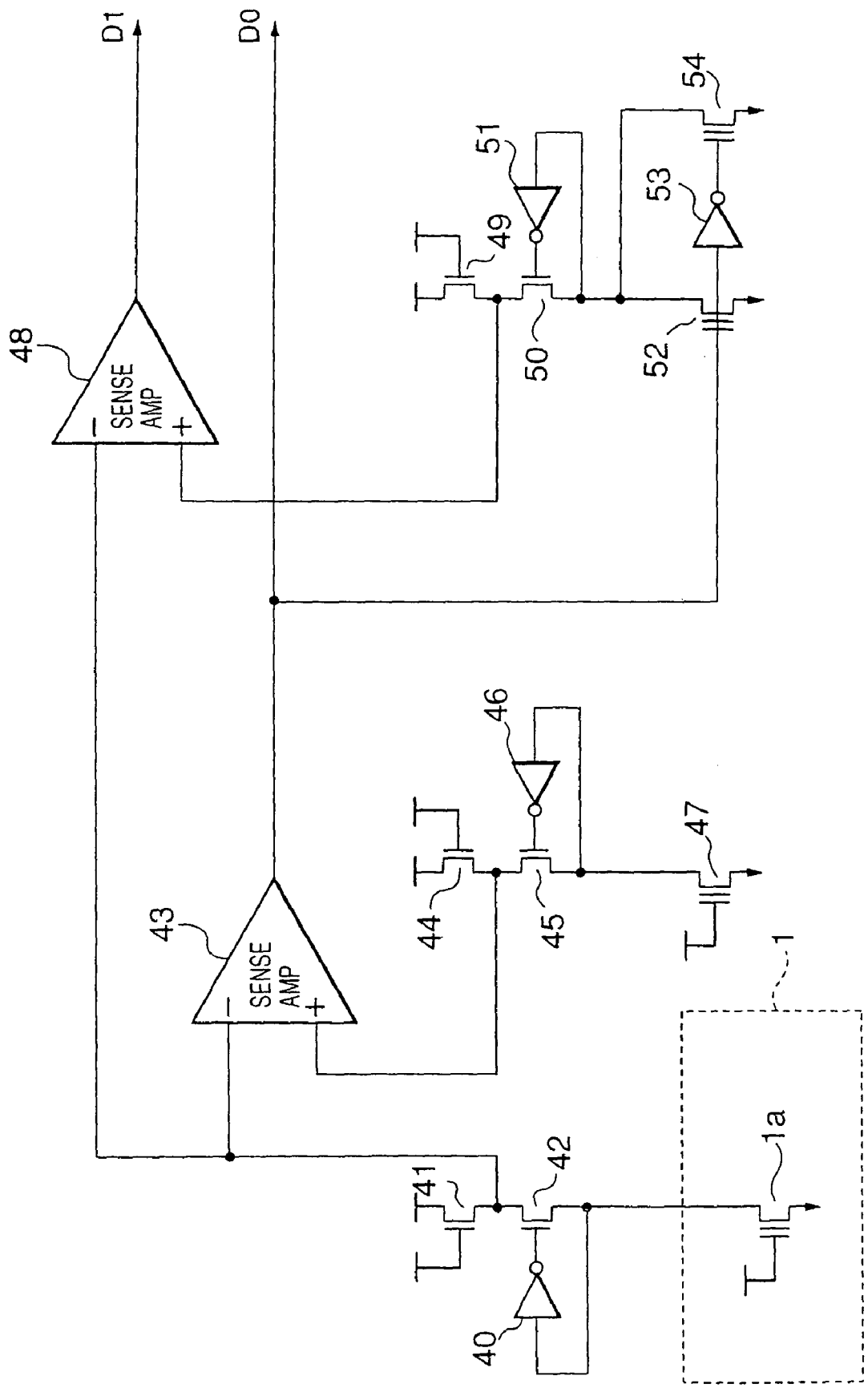
FIG. 11 is a block diagram for explaining another method of judging a threshold voltage.

A judging circuit shown in FIG. 11 is provided between the cell array 1 and the multiplexer 4 shown in FIG. 1. In FIG. 11, a threshold voltage Vth1 is applied to the inverting input terminal of a sense amplifier 43 via first output buffer. The first output buffer includes an inverter 40 and transistors 41 and 42. The threshold voltage Vth1 corresponds to a low-order bit D0 set in a memory cell 1a of the memory cell array 1. Applied to the non-inverting input terminal of the sense amplifier 43 via second output buffer is a judging voltage V47 set in a transistor 47. The second output buffer includes an inverter 46 and transistors 44 and 45.

When the threshold voltage Vth1 is smaller than the judging voltage V47, the output of the sense amplifier 43 becomes HIGH. Thus, the low-order bit D0 is judged to be "1".

Since the output of the sense amplifier 43 is HIGH, a transistor 52 turns on, while a transistor 54 turns off due to the existence of an inverter 53 provided between both transistors.

A judging voltage V52 set in the transistor 52 is thus applied to the non-inverting input terminal of a sense 5 amplifier 48 via third output buffer. The third output buffer includes an inverter S1 and transistors 49 and 50.

Further, a threshold voltage Vth2 corresponding to a high-order bit D1 set in the memory cell 1a is applied to the inverting input terminal of the sense amplifier 48 via first output buffer.

When the threshold voltage Vth2 is smaller than the judging voltage V52, the high-order bit D1 is judged to be "1" because the output of the sense amplifier 48 becomes HIGH. On the other hand, when Vth2 is greater than V52, the high-order bit D1 is judged to be "0" because the output of the sense amplifier 48 becomes LOW. Next, when the threshold voltage Vth1 is greater than the judging voltage V47, the low-order bit D0 is judged to be "0" because the output of the sense amplifier 43 becomes LOW.

Since the output of the sense amplifier 43 is LOW, the transistor 52 turns off, while the transistor 54 turns on due to the existence of the inverter 53. A judging voltage V54 set in the transistor 54 is applied to the non-inverting input terminal of the sense amplifier 48 via third output buffer. Applied to the inverting input terminal of the sense amplifier 48 is the threshold voltage Vth2 via first output buffer.

When the threshold voltage Vth2 is smaller than the judging voltage V54, the high-order bit D1 is judged to be "1" because the output of the sense amplifier 48 becomes HIGH. On the other hand, when Vth2 is greater than V54, the high-order bit D1 is judged to be "0" because the output of the sense amplifier becomes LOW.

As described above, 2-bit (4-level) data (00, 01, 10, 11) is judged. The judging circuit shown in FIG. 11 can be applied to a four-level (or more) memory cell by increasing the number of sense amplifiers and judging voltage applying circuits according to the number of data bits.

Further, the scope of the present invention includes the following case: the program codes of software for achieving the functions as disclosed by the preferred embodiments according to the present invention are supplied to a system or a computer connected to various devices activated so as to achieve those functions. Further, the above-mentioned devices are activated in accordance with a program stored in the system or the computer (CPU or MPU).

Further, in this case, the program codes themselves of the software can achieve the functions of the preferred embodiments according to the present invention. The program codes themselves and means for supplying the program codes to the computer, such as a storage medium 31 shown in FIG. 1 for storing the program codes are included in the scope of the present invention.

That is, the program codes stored in the storage medium 31 are read by a recording and reproducing apparatus 30 shown in FIG. 1 connected to the signal controller 6 via input I/F 8, so that the computer constituting the signal controller 6 can be activated. Further, as the storage medium 31 for recording these programs and codes, there are a floppy disk, a hard disk, an optical disk, a magneto-optic disk, CD-ROM, a magnetic tape, a non-volatile memory card, a ROM, etc.

As described above, according to the present invention, even if multilevel data stored in a single memory cell is lost, it is possible to execute the error correction effectively.

Further, according to the present invention, since data of higher access frequency can be read at high speed according to the input logical addresses, it is possible to shorten the access time markedly in data read operation.

What is claimed is:

1. A memory device comprising:
    a plurality of multilevel memory cells, wherein individual ones of the memory cells are configured to store a value that represents at least three bits; and
    memory control circuitry configured to control the writing of a first codeword and a second codeword within the plurality of memory cells, wherein the first and second codewords individually include a plurality of bits representing data and an associated error correction code, wherein the associated error correction code of the first codeword is encoded such that two bit errors of the first codeword can be corrected, and wherein the memory control circuitry is further configured to control the values stored within the memory cells such that individual ones of the memory cells store at least two bits of the first codeword and at least one bit of the second codeword.

2. The memory device as recited in claim 1 wherein the memory control circuitry is configured to correct the data of either of the first and second codewords using the associated error correction codes even if a complete corruption of data stored in any one of the memory cells occurs.

3. The memory device as recited in claim 1 wherein individual ones of the memory cells are configured to store any one of eight voltage levels to thereby represent three bits.

4. The memory device as recited in claim 1 wherein individual ones of the memory cells are configured to store any one of sixteen voltage levels to thereby represent four bits, and wherein the associated error of the second codeword is encoded such that two bit errors of the second codeword can be corrected, and wherein the memory control circuitry is further configured to control the values stored within the memory cells such that individual ones of the memory cells store two bits of the first codeword and two bits of the second codeword.

5. The memory device as recited in claim 1 wherein the error correction code associated with the second codeword is a single-error-correction code.

6. The memory device as recited in claim 1 wherein each of the plurality of multilevel memory cells is electrically erasable and programmable.

7. A system comprising:
a memory device; and
a computer operable to activate the memory device, wherein the memory device includes:
a plurality of multilevel memory cells, wherein individual ones of the memory cells are configured to store a value that represents at least three bits; and
memory control circuitry configured to control the writing of a first codeword and a second codeword within the plurality of memory cells, wherein the first and second codewords individually include a plurality of bits representing data and an associated error correction code, wherein the associated error correction code of the first codeword is encoded such that two bit errors of the first codeword can be corrected, and wherein the memory control circuitry is further configured to control the values stored within the memory cells such that individual ones of the memory cells store at least two bits of the first codeword and at least one bit of the second codeword.

8. The system as recited in claim 7 wherein the memory control circuitry is configured to correct the data of either of the first and second codewords using the associated error correction codes even if a complete corruption of data stored in any one of the memory cells occurs.

9. The system as recited in claim 7 wherein each of the memory cells is configured to store any one of eight voltage levels to thereby represent three bits.

10. The system as recited in claim 7 wherein individual ones of the memory cells are configured to store any one of sixteen voltage levels to thereby represent four bits, and wherein the associated error of the second codeword is encoded such that two bit errors of the second codeword can be corrected, and wherein the memory control circuitry is further configured to control the values stored within the memory cells such that individual ones of the memory cells store two bits of the first codeword and two bits of the second codeword.

11. The system as recited in claim 7 wherein the error correction code associated with the second codeword is a single-error-correction code.

12. The system as recited in claim 7 wherein each of the plurality of multilevel memory cells is electrically erasable and programmable.

13. A method of storing data in a memory device including a plurality of multilevel memory cells, wherein individual ones of the memory cells are configured to store a value that represents at least three bits, the method comprising:
receiving a first codeword and a second codeword, wherein the first and second codewords individually include a plurality of bits representing data and an associated error correction code, wherein the associated error correction code of the first codeword is encoded such that two bit errors of the first codeword can be corrected; and
controlling values stored within the memory cells such that individual ones of the memory cells store at least two bits of the first codeword and at least one bit of the second codeword.

14. The method as recited in claim 13 further comprising correcting the data of either of the first and second codewords using the associated error correction codes even if a complete corruption of data stored in any one of the memory cells occurs.

15. The method as recited in claim 13 wherein individual ones of the memory cells are configured to store any one of eight voltage levels to thereby represent three bits.

16. The method as recited in claim 13 wherein individual ones of the memory cells are configured to store any one of sixteen voltage levels to thereby represent four bits, and wherein the associated error of the second codeword is encoded such that two bit errors of the second codeword can be corrected, and wherein controlling the values stored in the memory cells includes controlling the values stored within the memory cells such that individual ones of the memory cells store two bits of the first codeword and two bits of the second codeword.

17. The method as recited in claim 13 wherein the error correction code associated with the second codeword is a single-error-correction code.

18. The method as recited in claim 13 wherein each of the plurality of multilevel memory cells is electrically erasable and programmable.

* * * * *